US009117711B2

(12) United States Patent
Suzuki et al.

(10) Patent No.: US 9,117,711 B2
(45) Date of Patent: Aug. 25, 2015

(54) SOLID-STATE IMAGE SENSOR EMPLOYING COLOR FILTERS AND ELECTRONIC APPARATUS

(71) Applicant: Sony Corporation, Tokyo (JP)

(72) Inventors: Tsuyoshi Suzuki, Kanagawa (JP);
Shinichiro Saito, Kanagawa (JP)

(73) Assignee: Sony Corporation, Tokyo (JP)

( * ) Notice: Subject to any disclaimer, the term of this patent is extended or adjusted under 35 U.S.C. 154(b) by 333 days.

(21) Appl. No.: 13/707,137

(22) Filed: Dec. 6, 2012

(65) Prior Publication Data

US 2013/0153748 A1    Jun. 20, 2013

(30) Foreign Application Priority Data

Dec. 14, 2011   (JP) ................................. 2011-273817

(51) Int. Cl.
*H04N 9/04* (2006.01)
*H01L 27/146* (2006.01)

(52) U.S. Cl.
CPC .......... *H01L 27/14607* (2013.01); *H04N 9/045* (2013.01); *H01L 27/1461* (2013.01); *H01L 27/14605* (2013.01); *H01L 27/14645* (2013.01)

(58) Field of Classification Search
USPC ........ 250/208.1, 214.1, 214 R, 216; 348/271, 348/272, 275, 278, 279; 345/88
See application file for complete search history.

(56) References Cited

U.S. PATENT DOCUMENTS

| 2005/0041188 A1* | 2/2005 | Yamazaki ..................... 349/146 |
| 2006/0273240 A1* | 12/2006 | Guidash et al. ............ 250/208.1 |
| 2009/0102768 A1* | 4/2009 | Shimizu ......................... 345/88 |

FOREIGN PATENT DOCUMENTS

| JP | 2006-165567 | 6/2006 |
| JP | 2006-270364 | 10/2006 |
| JP | 2010-161200 | 7/2010 |

* cited by examiner

*Primary Examiner* — Francis M Legasse, Jr.
(74) *Attorney, Agent, or Firm* — Sony Corporation

(57) ABSTRACT

A solid-state image sensor includes pixel units each having a group of pixels forming a polygonal outer shape to cover an entire light receiving plane. The polygonal outer shape has at least six equilateral sides and the group of pixels includes pixels receiving light of at least four different colors.

22 Claims, 21 Drawing Sheets

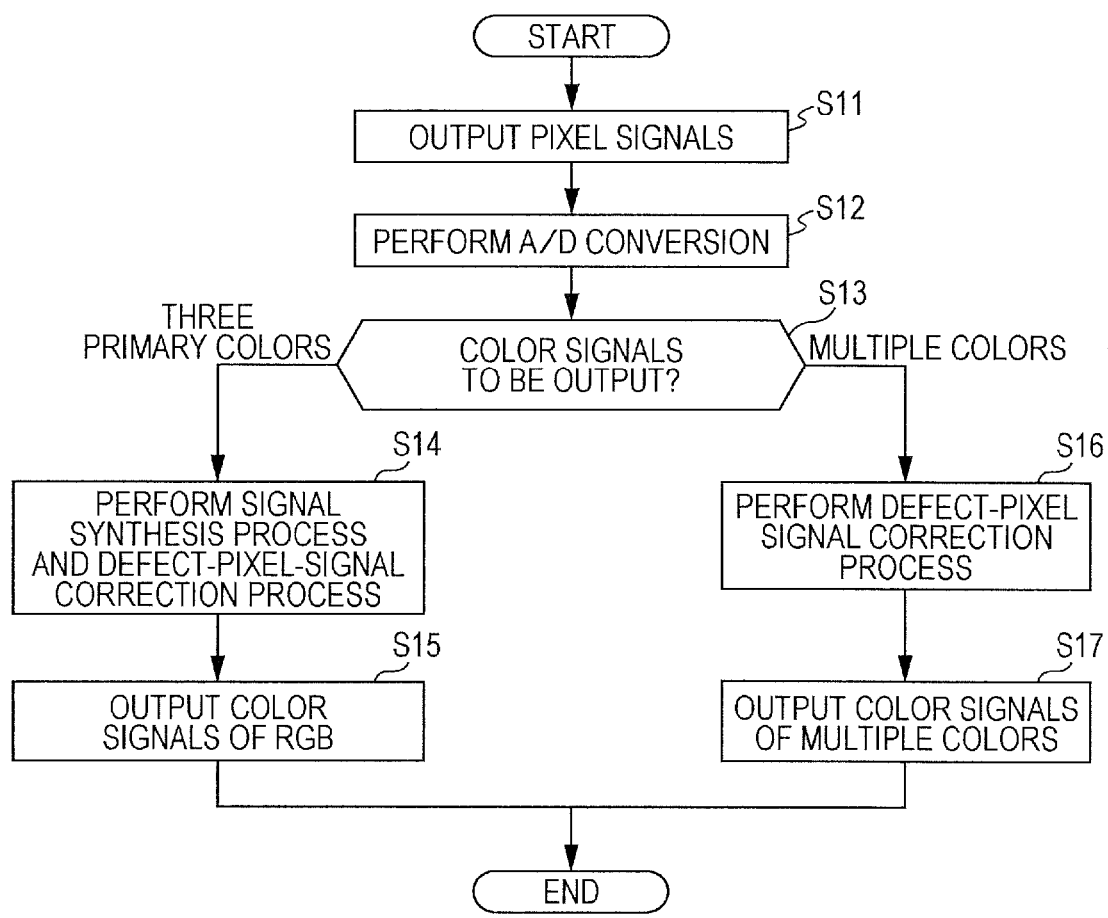

SOLID-STATE IMAGE SENSOR EMPLOYING COLOR FILTERS AND ELECTRONIC APPARATUS

BACKGROUND

The present disclosure relates to solid-state image sensors and electronic apparatuses, and particularly relates to a solid-state image sensor and an electronic apparatus which are capable of obtaining high-quality images.

In a general solid-state image sensor, pixels receive light transmitted through three-primary color filters, for example, in a light receiving plane in which the pixels having photoelectric conversion elements which convert light into charges are arranged in a planar manner. For example, in a general solid-state image sensor employing color filters of Bayer arrangement, a pixel unit including four pixels, i.e., one red pixel, two green pixels, and one blue pixel, which are combined with one another is used.

Furthermore, in recent years, a pixel unit including other colors in addition to the three primary colors has been proposed. For example, a pixel unit including four pixels, i.e., a red pixel, a green pixel, a blue pixel, and a white pixel, which are combined with one another has been proposed. The white pixel which does not have a color filter is added in this pixel unit. In this way, when the number of colors of the color filters used in the solid-state image sensor is increased, color reproducibility is improved.

Referring now to FIG. 1, a solid-state image sensor employing color filters of six colors, i.e., red, green, blue, cyan, magenta, and yellow will be described, for example. FIG. 1A is a diagram schematically illustrating a configuration of a light receiving plane of a solid-state image sensor. FIG. 1B is a diagram illustrating CIExy chromaticity which is a color system defined by the CIE (Commission Internationale de l'Eclairage).

As illustrated in FIG. 1A, a solid-state image sensor 11 includes a plurality of pixels 12 arranged in a matrix and vertical transmission paths 13 which transmit pixel signals output from the pixels 12 and which are arranged between columns of the pixels 12.

The solid-state image sensor 11 further includes pixel units 14 each of which is configured by combining a pixel 12-1 which receives red (R) light, a pixel 12-2 which receives green (G) light, a pixel 12-3 which receives blue (B) light, a pixel 12-4 which receives cyan (C) light, a pixel 12-5 which receives magenta (M) light, and a pixel 12-6 which receives yellow (Y) light with one another. Then the pixel units 14 which receive six color light beams are periodically arranged on the entire light receiving plane of the solid-state image sensor 11.

Although the solid-state image sensor 11 capable of receiving multi-color light has high color reproducibility, resolution is degraded. Specifically, in the solid-state image sensor 11, pixels which receive the same color light are spaced away from each other by a pitch corresponding to three pixels in a row direction and a pitch corresponding to two pixels in a column direction.

FIG. 1B represents that a color region represented by six colors (a hexagonal region defined by vertices denoted by triangles in FIG. 1B) has higher reproducibility than a color region represented by three primary colors (a triangle region defined by vertices denoted by circles in FIG. 1B).

However, a solid-state image sensor capable of performing color processing of multiple colors including four colors or more has high color reproducibility but has low resolution. Furthermore, color detection of retinas of human beings is based on three primary colors, and therefore, even when the number of colors is increased, considerably large effect is not expected. On the other hand, since the resolution is degraded when the number of colors is increased, a method for preventing the resolution from being degraded even when the number of colors is increased is demanded.

Note that a display apparatus which is provided with color filters for four colors i.e., red, green, blue, and yellow, to improve color reproducibility has been developed. Furthermore, in the future, development of a display apparatus for professional use which is provided with color filters of four colors or more to further improve the color reproducibility is expected. However, colors which are subjected to signal processing performed by an image pickup device are three colors including red, blue, and green (or four colors additionally including white).

Here, Japanese Unexamined Patent Application Publication No. 2006-270364 discloses a solid-state image sensor including small complementary color pixels embedded in gaps among pixels of red, green, and blue. However, since each of the complementary color pixels includes a dual-wavelength signal in this solid-state image sensor, charges generated by the complementary color pixels reach nearly twice as much as those generated by the red, green, and blue pixels. Accordingly, it is considered that amounts of charges are saturated in the small complementary color pixels and false color is generated.

Furthermore, Japanese Unexamined Patent Application Publication No. 2006-165567 discloses a solid-state image sensor in which a plane coverage of pixels is improved by covering a plane by hexagonal pixels.

Moreover, Japanese Unexamined Patent Application Publication No. 2010-161200 discloses a solid-state image sensor in which a periodic structure is configured by a unit of seven hexagonal pixels. However, this solid-state image sensor has a complicated periodic structure, and therefore, signal processing performed for outputting pixel signals is also complicated.

SUMMARY

In general, resolution of a solid-state image sensor which obtains multiple color signals is degraded as described above, and therefore, development of a solid-state image sensor capable of obtaining high-quality images while multiple colors and high resolution are simultaneously achieved is demanded.

Accordingly, it is desirable to obtain high-quality images.

According to an embodiment of the present disclosure, a solid-state image sensor includes pixel units and each of the pixel units has a group pixels forming a polygonal outer shape designed to cover an entire light receiving plane. The polygonal outer shape has at least six equilateral sides and the group of pixels includes pixels respectively receiving light of at least four different colors.

According to another embodiment of the present disclosure, a solid-state image sensor includes pixels units and each of the pixel units has a group of pixels forming a polygonal outer shape designed to cover an entire light receiving plane. The polygonal outer shape has at least six equilateral sides and the group of pixels includes pixels respectively receiving light of at least six different colors, such as red, green, blue, cyan, magenta, and yellow. Furthermore, the different color is located diagonally to a complementary color. For example, red is located diagonally to cyan, green is located diagonally to magenta, and yellow is located diagonally to blue.

Accordingly, high-quality images may be obtained.

BRIEF DESCRIPTION OF THE DRAWINGS

FIG. 16 is a diagram illustrating a configuration of a third arrangement example of pixel units including pixels arranged as;

FIG. 25 is a flowchart illustrating a process performed by the image pickup device.

DETAILED DESCRIPTION OF EMBODIMENTS

Hereinafter, embodiments of the present technique will be described in detail with reference to the accompanying drawings.

Figure 1A:
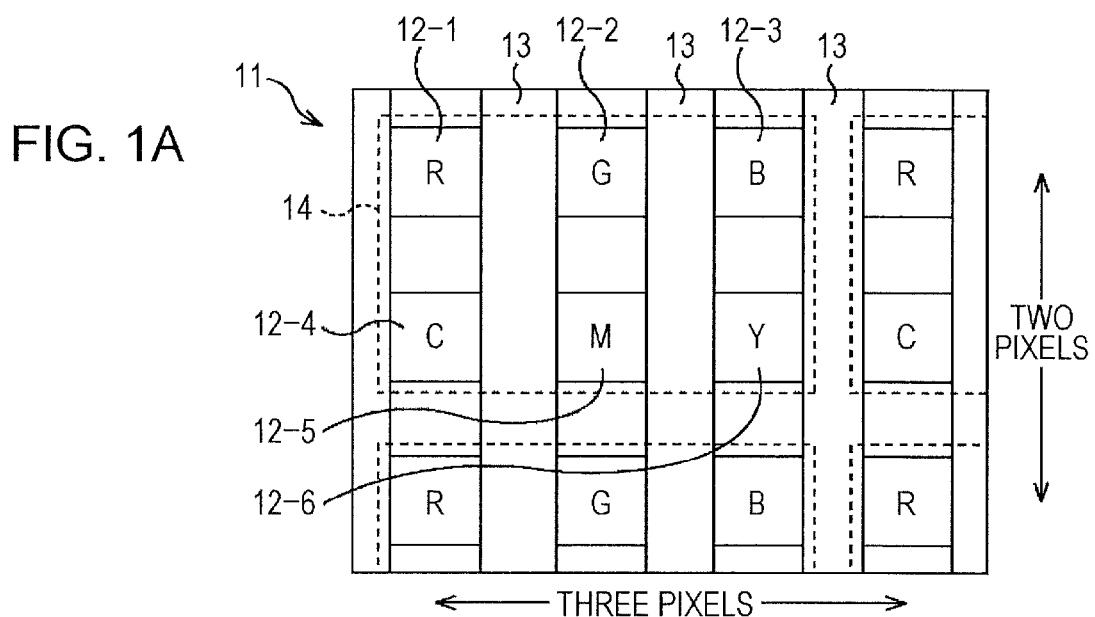
FIGS. 1A and 1B are diagrams illustrating a general solid-state image sensor.
Figure 1B:
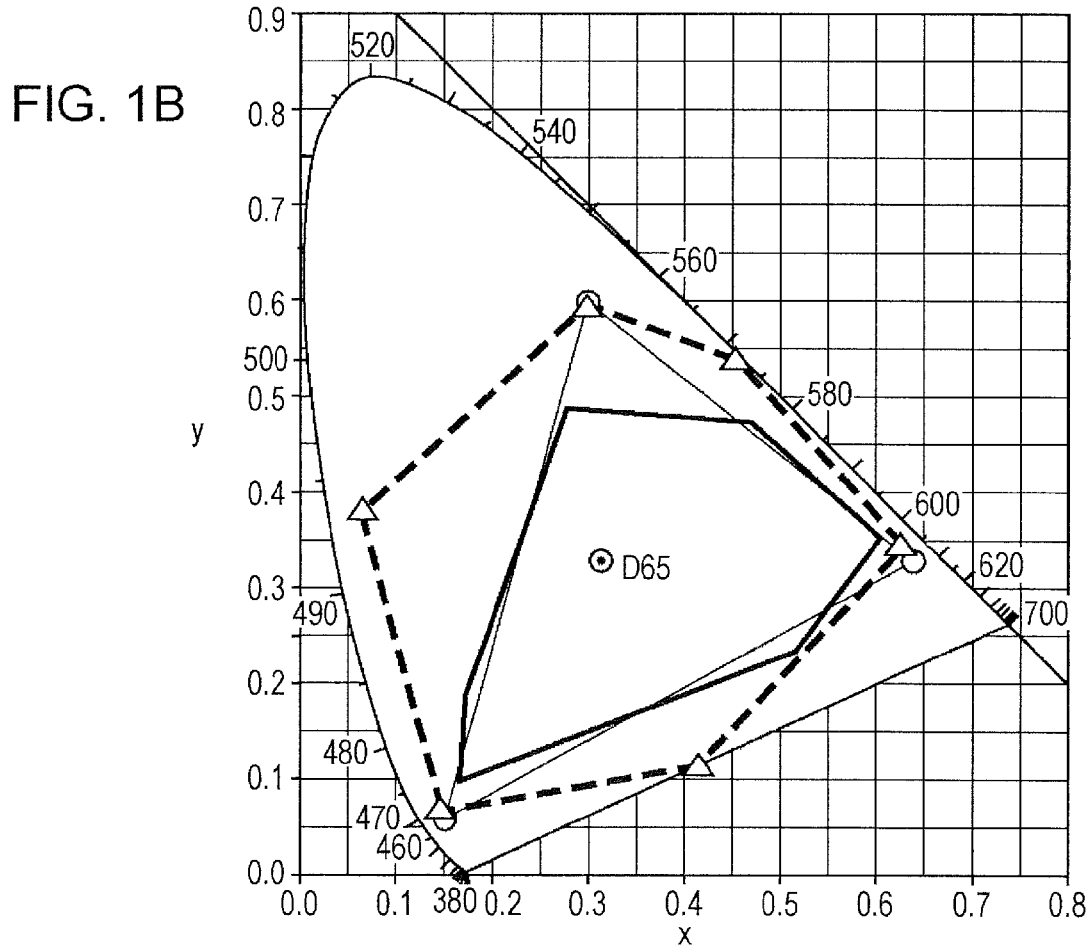
Figure 2:
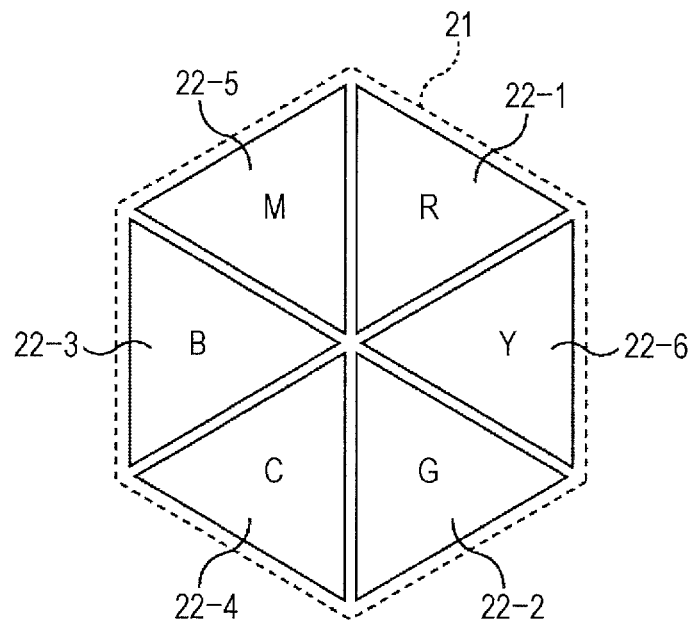
FIG. 2 is a diagram illustrating a configuration of a pixel unit included in a solid-state image sensor to which the present technique is employed according to a first embodiment.

FIG. 2 is a diagram illustrating a configuration of a pixel unit included in a solid-state image sensor to which the present technique is employed according to a first embodiment.

As illustrated in FIG. 2, a pixel unit 21 includes a group of six pixels 22-1 to 22-6. Each of the pixels 22-1 to 22-6 has a triangle shape as an outer shape in plan view, and the pixels 22-1 to 22-6 are arranged such that two sides of the adjacent pixels 22 face to each other. In this way, the pixel unit 21 including the group of the pixels 22-1 to 22-6 has a hexagonal outer shape.

The different pixels 22-1 to 22-6 receive light through color filters of different colors, and output pixel signals obtained by converting corresponding color light into electric signals. The pixels 22-1 to 22-6 are arranged such that the pixels 22 which have complementary colors relative to each other are diagonally arranged.

For example, the pixel 22-1 which receives red (R) light and the pixel 22-4 which receives cyan (C) light are diagonally arranged. Similarly, the pixel 22-2 which receives green (G) light and the pixel 22-5 which receives magenta light are diagonally arranged, the pixel 22-3 which receive blue (B) light and the pixel 22-6 which receives yellow (Y) light are diagonally arranged. With this arrangement, when a defect occurs in one of the pixels 22 and correction is performed on the defect pixel 22, for example, false color is prevented from being generated.

Here, signal processing performed on pixel signals output from the pixel unit 21 including the pixels 22-1 to 22-6 will be described.

For example, a red pixel signal R, a green pixel signal G, and a blue pixel signal B may be synthesized by performing signal processing on a cyan pixel signal C, a magenta pixel signal M, and yellow pixel signal Y.

Specifically, the red pixel signal R may be obtained using the cyan pixel signal C, the magenta pixel signal M, and the yellow pixel signal Y in accordance with Expression (1) below. Similarly, the green pixel signal G can be obtained using the cyan pixel signal C, the magenta pixel signal M, and the yellow pixel signal Y in accordance with Expression (2) below. Furthermore, the blue pixel signal B can be obtained using the cyan pixel signal C, the magenta pixel signal M, and the yellow pixel signal Y in accordance with Expression (3) below.

$$R=(-C+Y+M)/2 \qquad (1)$$

$$G=(C+Y-M)/2 \qquad (2)$$

$$B=(C-Y+M)/2 \qquad (3)$$

Similarly, the cyan pixel signal C, the magenta pixel signal M, and the yellow pixel signal Y may be synthesized by performing signal processing on the red pixel signal R, the green pixel signal G, and the blue pixel signal B.

Specifically, the cyan pixel signal C may be obtained using the green pixel signal G and the blue pixel signal B in accordance with Expression (4) below. Furthermore, the magenta pixel signal M may be obtained using the red pixel signal R and the blue pixel signal B in accordance with Expression (5)

below, and the yellow pixel signal Y may be obtained using the red pixel signal R and the green pixel signal G in accordance with Expression (6).

$$C = G + B \quad (4)$$

$$M = B + R \quad (5)$$

$$Y = G + R \quad (6)$$

Here, the pixel signals may be synthesized by calculating Expression (1) to Expression (6) and weighting the pixel signals where appropriate. For example, the pixel signals may be multiplied by coefficients where appropriate in accordance with transmissivity of light signals of the color filters and conversion efficiency of the pixels 22 (photodiodes or photoelectric conversion films).

For example, it is assumed that a display device which displays an image captured by an image pickup device including a solid-state image sensor having the pixel unit 21 on a light receiving plane is capable of displaying an image represented by six colors including red, green, blue, cyan, magenta, and yellow. In this case, the image pickup device performs A/D (Analog/Digital) conversion on pixel signals output from the pixels 22-1 to 22-6, and thereafter, outputs the pixel signals to the display device without performing a process of synthesizing the pixel signals.

On the other hand, it is assumed that the display device is not capable of displaying an image represented by the six colors and is capable of displaying an image represented by three colors including red, green, and blue. In this case, the image pickup device performs A/D (Analog/Digital) conversion on image signals output from the pixels 22-1 to 22-6, and thereafter, performs a process of synthesizing the pixel signals, and outputs the pixel signals to the display device.

Specifically, the red pixel signal R, the green pixel signal G, and the blue pixel signal B may be synthesized by calculating Expression (1) to Expression (3) utilizing the pixel signal C output from a coordinate of the pixel 22-4 which receives cyan light, the pixel signal M output from a coordinate of the pixel 22-5 which receives magenta light, and the pixel signal Y output from a coordinate of the pixel 22-6 which receives yellow light. The red pixel signal R, the green pixel signal G, and the blue pixel signal B may be subjected to image processing as pixel signals located in the vicinity of the pixels 22-4 to 22-6.

For example, pixel signals obtained in a process of synthesizing pixel signals may be subjected to image processing as pixel signals located in positions of complementary colors of corresponding pixels 22. Specifically, image processing may be performed while it is determined that the obtained red pixel signal R is positioned in the pixel 22-4, the obtained green pixel signal G is positioned in the pixel 22-5, and the obtained blue pixel signal B is positioned in the pixel 22-6.

As described above, by performing a process of synthesizing pixel signals, resolution of an image is prevented from being degraded when the image is output to a display device capable of displaying an image represented by three colors including red, green, and blue, for example. Specifically, when only the pixels 22-1 to 22-3 which output the red pixel signal R, the green pixel signal G, and the blue pixel signal B, respectively, are used, the number of pixels used for an image is reduced since the pixels 22-4 to 22-6 are not used. On the other hand, when the process of synthesizing image signals is performed, the red pixel signal R, the green pixel signal G, and the blue pixel signal B may be obtained from outputs of the pixels 22-4 to 22-6, and accordingly, the number of pixels used for an image is prevented from being reduced and resolution is also prevented from being degraded.

Furthermore, in the image pickup device including the solid-state image sensor including the pixel unit 21 disposed on the light receiving plane, even when a defect occurs in one of the pixels 22, a pixel signal of the defect pixel 22 may be synthesized by calculating Expression (1) to Expression (6) above. In this case, when a pixel signal output from another one of the pixels 22 which is different from the defect pixel 22 and which is included in the same pixel unit 21, that is, a pixel signal output from the different pixel 22 positioned in the vicinity of the defect pixel 22 is used in the process of synthesizing pixel signals, appropriate color may be reproduced.

In particular, as illustrated in FIG. 2, since pairs of pixels 22 which are complementary colors of the other are diagonally arranged, accuracy of correction of the pixel signal of the defect pixel 22 is improved. When a defect occurs in the pixel 22-5 which receives magenta light, for example, the pixel signal R which is output from the pixel 22-1 located in the vicinity of the pixel 22-5 and the pixel signal B which is output from the pixel 22-3 located in the vicinity of the pixel 22-5 are used to synthesize a pixel signal M. Therefore, prediction accuracy of the pixel signal M is improved when compared with a case where a pixel signal output from one of the pixels 22 which is located far from the pixel 22-5 is used, and false color is prevented from being generated.

Furthermore, the pixel unit 21 has a pixel sharing configuration in which the pixels 22-1 to 22-6 have respective photoelectric conversion elements which convert light into charges and the pixels 22-1 to 22-6 share transistors and the like which amplify the charges.

Figure 3:
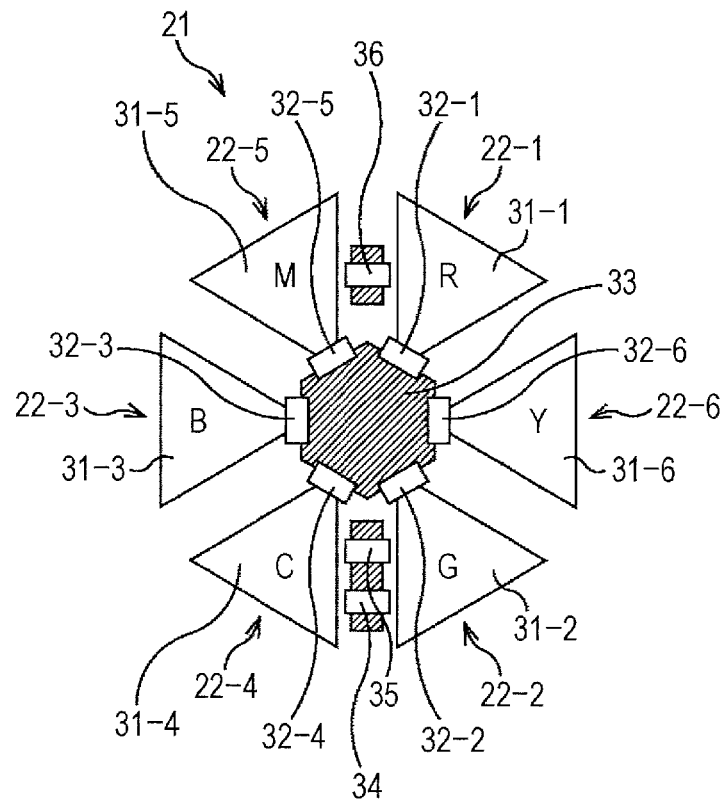
FIG. 3 is a diagram illustrating a first configuration of the pixel unit.

Referring to FIG. 3, a first configuration of the pixel unit 21 will be described.

As illustrated in FIG. 3, the pixel unit 21 includes photoelectric conversion elements 31-1 to 31-6 and transfer gates 32-1 to 32-6 which are included in the pixels 22-1 to 22-6, respectively, an FD (Floating Diffusion) 33, an amplification transistor 34, a selection transistor 35, and a reset transistor 36.

The photoelectric conversion elements 31-1 to 31-6 which are photodiodes or photoelectric conversion films generate charges by receiving light which is transmitted through on-chip lenses, not shown, and store the charges. Furthermore, the photoelectric conversion elements 31-1 to 31-6 have triangle outer shapes so as to correspond to the shapes of the pixels 22-1 to 22-6. Note that the on-chip lenses are small lenses disposed on the light receiving plane of the solid-state image sensor to collect light onto photoelectric conversion elements 31 and is disposed so as to contact with the triangles of the outer shapes of the photoelectric conversion elements 31 from inside. Furthermore, the on-chip lenses may be disposed in ranges larger than the photoelectric conversion elements 31 in a region occupied by the pixels 22, and may be disposed so as to contact with the triangles of the outer shapes of the photoelectric conversion elements 31 from outside.

The transfer gates 32-1 to 32-6 are arranged such that the photoelectric conversion elements 31-1 to 31-6 and the FD 33 are connected to each other through the transfer gates 32-1 to 32-6. When transistors serving as the photoelectric conversion elements 31-1 to 31-6 are turned on, the charges stored in the photoelectric conversion elements 31-1 to 31-6 are transferred to the FD 33.

The FD 33 is a floating diffusion region having a predetermined storage capacitance and stores the charges transferred from the photoelectric conversion elements 31-1 to 31-6 through the transfer gates 32-1 to 32-6 at different timings. Furthermore, the FD 33 is connected to a gate electrode of the amplification transistor 34, and a potential corresponding to the charge stored in the FD 33 is applied to the gate electrode of the amplification transistor 34.

The amplification transistor 34 amplifies the charge stored in the FD 33 and outputs a pixel signal of a level corresponding to the charge.

The selection transistor 35 is connected to a signal line which supplies the pixel signal output from the amplification transistor 34 to circuits in later stages. When the selection transistor 35 is turned on, the pixels signal to be output from the amplification transistor 34 to the signal line becomes ready to be output.

The reset transistor 36 is connected to a power source potential which is a predetermined fixed potential. When the reset transistor 36 is turned on, the charge stored in the FD 33 is discharged to the power source potential so that the FD 33 is reset (initialized) to prepare for the next charge transfer.

In the pixel unit 21 configured as described above, the charges generated in the photoelectric conversion elements 31-1 to 31-6 are successively transferred through the corresponding transfer gates 32-1 to 32-6 to the FD 33 at timings in which pixel signals of the individual pixels 22-1 to 22-6 are read. Then the amplification transistor 34 amplifies the charge of the FD 33 for individual pixels 22-1 to 22-6 and outputs pixel signals through the selection transistor 35, and the reset transistor 36 resets the charge of the FD 33.

As described above, since six color light beams are received by the pixels 22-1 to 22-6 and pixel signals are output in the pixel unit 21, color reproducibility is improved when compared with a configuration in which three primary colors are utilized, for example. Furthermore, since the pixels 22-1 to 22-6 share the FD 33, the amplification transistor 34, the selection transistor 35, and the reset transistor 36, an area of the photoelectric conversion elements 31 may be enlarged when compared with the configuration in which the elements are provided for individual pixels 22. By this, characteristics of the pixels 22-1 to 22-6 are improved.

Furthermore, since the pixel unit 21 has the hexagonal shape formed by combining the triangle shapes of the pixels 22-1 to 22-6, when the pixel units 21 are disposed on the light receiving plane of the solid-state image sensor, the plane may be covered with a simple periodic structure.

Figure 4:
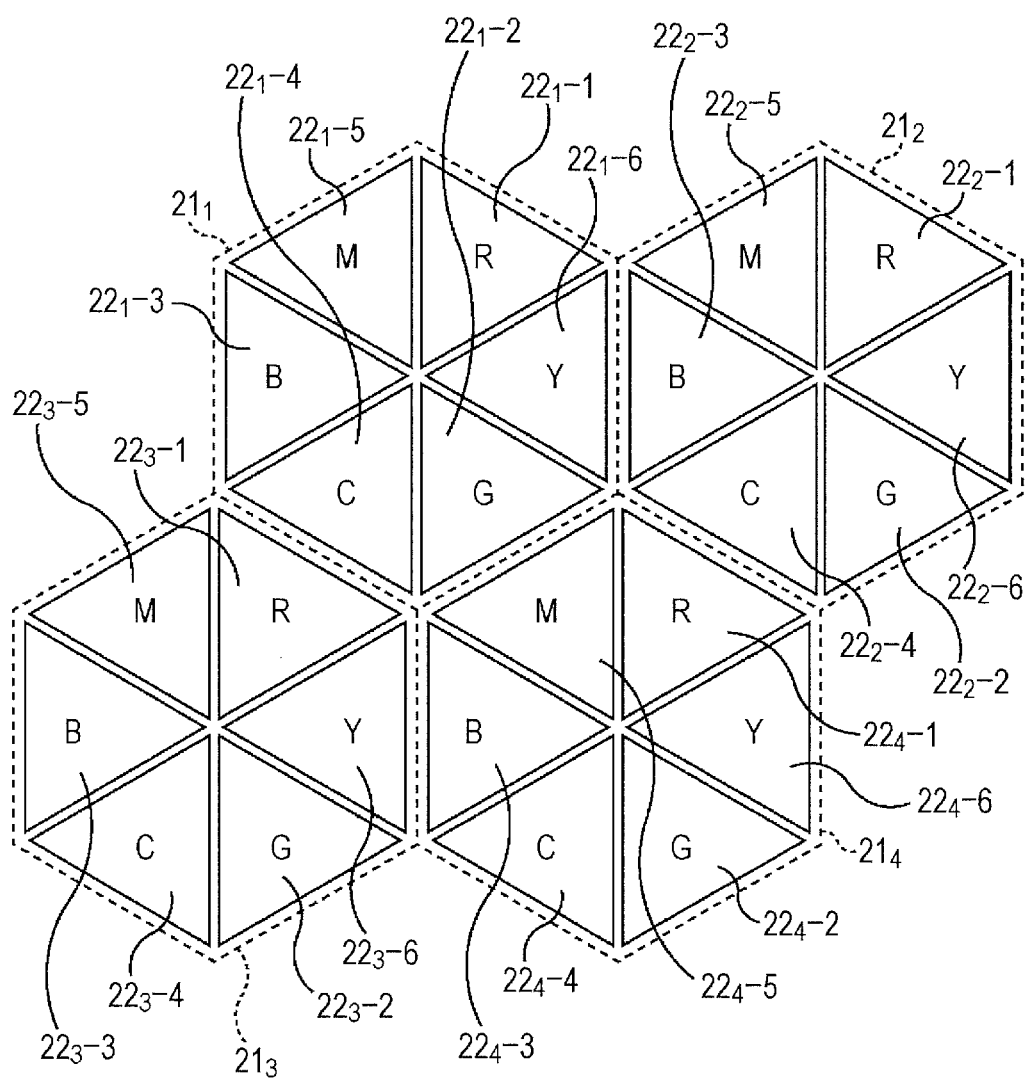
FIG. 4 is a diagram illustrating the pixel units which are periodically arranged.

FIG. 4 is a diagram illustrating four pixel units 21$_1$ to 21$_4$ which are periodically arranged, for example. As described above, the pixel units 21 may cover the plane with the simple periodic structure since the pixel units 21 have the hexagonal shape. By this, in the solid-state image sensor including the pixel units 21 disposed on the light receiving plane, the pixels 22 corresponding to multiple colors are employed and the plane coverage of the pixels 22 is improved. Furthermore, since the pixel units 21 are arranged in the simple periodic structure, an image process of generating an image from pixel signals output from the solid-state image sensor is easily performed. Furthermore, since pixels 22 which receive light of the same color are arranged with a pitch of two pixels, the resolution is prevented from being degraded.

Note that, as a configuration of the pixel unit 21, a configuration in which all the pixels 22-1 to 22-6 illustrated in FIG. 3 share the one FD 33 or a configuration in which a plurality of FDs 33 are provided and each of the FDs 33 is shared by a predetermined number of pixels 22 selected from the pixels 22-1 to 22-6 may be employed. Furthermore, instead of the configuration in which the FD 33 or the FDs 33 are shared, a configuration in which FDs 33 are provided for individual pixels 22-1 to 22-6 may be employed.

Figure 5A:
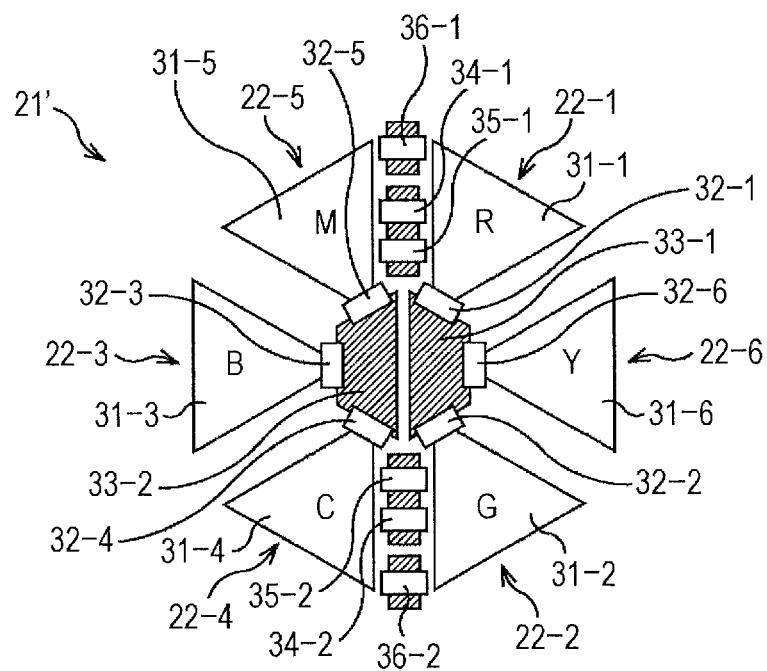
FIGS. 5A and 5B are diagrams illustrating second and third configurations of the pixel unit.
Figure 5B:
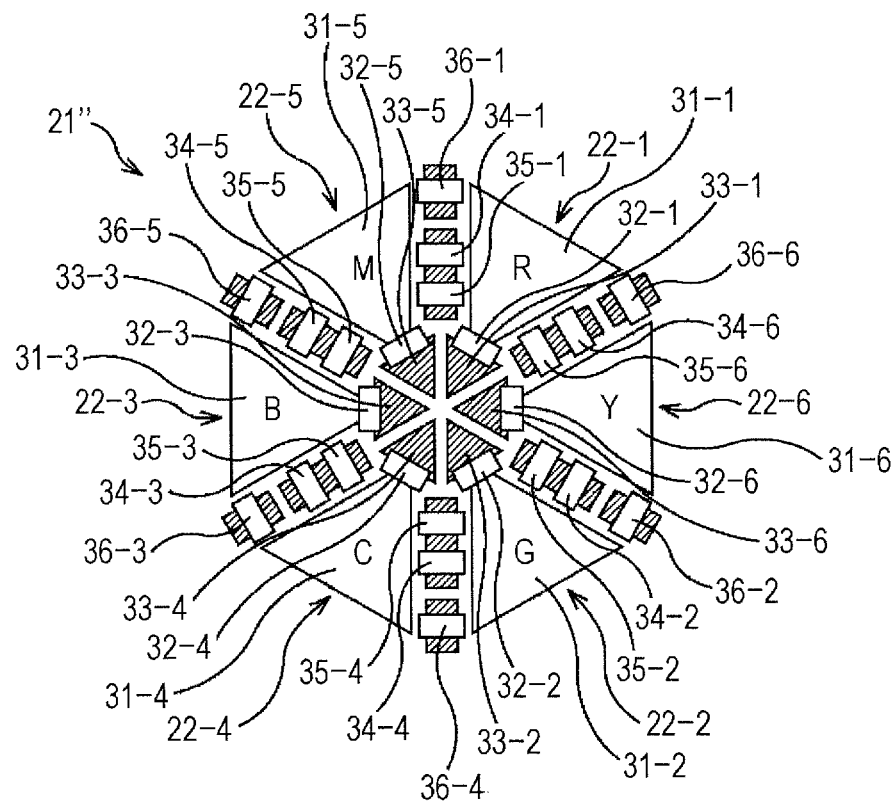

FIGS. 5A and 5B are diagrams illustrating second and third configurations of the pixel unit 21. Note that, in FIGS. 5A and 5B, configurations the same as those of the pixel unit 21 of FIG. 3 are denoted by reference numerals the same as those of the pixel unit 21 of FIG. 3, and detailed descriptions thereof are omitted.

A pixel unit 21' illustrated in FIG. 5A includes photoelectric conversion elements 31-1 to 31-6, transfer gates 32-1 to 32-6, FDs 33-1 and 33-2, amplification transistors 34-1 and 34-2, selection transistors 35-1 and 35-2, and reset transistors 36-1 and 36-2.

In the pixel unit 21', to the FD 33-1, the photoelectric conversion elements 31-1 is connected through the transfer gate 32-1, the photoelectric conversion element 31-2 is connected through the transfer gate 32-2, and the photoelectric conversion element 31-6 is connected through the transfer gate 32-6. Similarly, in the pixel unit 21', to the FD 33-2, the photoelectric conversion elements 31-3 is connected through the transfer gate 32-3, the photoelectric conversion element 31-4 is connected through the transfer gate 32-4, and the photoelectric conversion element 31-5 is connected through the transfer gate 32-5.

Specifically, in the pixel unit 21', charges generated in the photoelectric conversion elements 31-1, 31-2, and 31-6 are successively transferred to the FD 33-1 at timings in which pixel signals are read from the pixels 22-1, 22-2, and 22-6. Thereafter, a process of amplifying the charge of the FD 33-1 using the amplification transistor 34-1, outputting a pixel signal through the selection transistor 35-1, and resetting the charge of the FD 33-1 using the reset transistor 36-1 is performed for each of the pixels 22-1, 22-2, and 22-6.

Similarly, in the pixel unit 21', charges generated in the photoelectric conversion elements 31-3, 31-4, and 31-5 are successively transferred to the FD 33-2 at timings in which pixel signals are read from the pixels 22-3, 22-4, and 22-5. Thereafter, a process of amplifying the charge of the FD 33-2 using the amplification transistor 34-2, outputting a pixel signal through the selection transistor 35-2, and resetting the charge of the FD 33-2 using the reset transistor 36-2 is performed for each of the pixels 22-3, 22-4, and 22-5.

As described above, in the pixel unit 21', the three pixels 22-1, 22-2, and 22-6 share the FD 33-1, the amplification transistor 34-1, the selection transistor 35-1, and the reset transistor 36-1. Furthermore, in the pixel unit 21', the three pixels 22-3, 22-4, and 22-5 share the FD 33-2, the amplification transistor 34-2, the selection transistor 35-2, and the reset transistor 36-2.

Note that the pixel unit 21 may include three FDs 33 and each of the FDs 33 may be shared by two of the pixels 22.

A pixel unit 21" illustrated in FIG. 5B includes photoelectric conversion elements 31-1 to 31-6, transfer gates 32-1 to 32-6, FDs 33-1 to 33-6, amplification transistors 34-1 to 34-6, selection transistors 35-1 to 35-6, and reset transistors 36-1 to 36-6.

In the pixel unit 21", charges generated in the photoelectric conversion elements 31-1 to 31-6 are transferred to the corresponding FDs 33-1 to 33-6 through the transfer gates 32-1 to 32-6. Then the amplification transistors 34-1 to 34-6 amplify the corresponding charges of the FDs 33-1 to 33-6 and output pixel signals through the selection transistors 35-1 to 35-6. Furthermore, the reset transistors 36-1 to 36-6 reset the charges of the corresponding FDs 33-1 to 33-6.

As described above, the pixel unit 21" employs the configuration in which the FDs are not shared, and the pixels 22-1 to 22-6 are individually driven.

Figure 6:
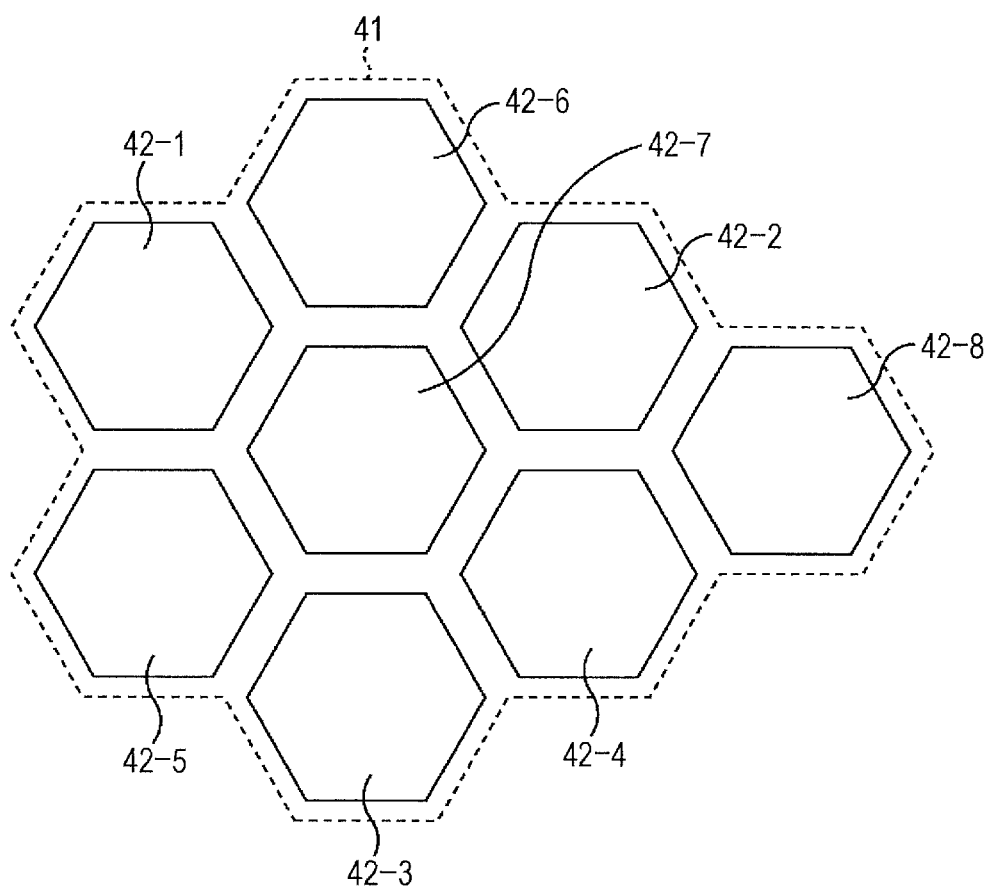
FIG. 6 is a diagram illustrating a configuration of a pixel unit according to a second embodiment.

Next, FIG. 6 is a diagram illustrating a configuration of a pixel unit included in a solid-state image sensor to which the present technique is employed according to a second embodiment.

As illustrated in FIG. 6, a pixel unit 41 includes a group of eight pixels 42-1 to 42-8. Each of the pixels 42-1 to 42-8 has a hexagonal outer shape in plan view. Furthermore, the six pixels 42-1 to 42-6 are arranged so as to surround the pixel 42-7, and the pixel 42-8 is arranged outside of a block including the pixels 42-1 to 42-7 so as to be adjacent to the block. Accordingly, the pixel unit 41 has an irregular shape (which is not rotation symmetry) in which the pixel 42-8 protrudes from a block including the pixels 42-1 to 42-7 which is formed as rotation symmetry.

Specifically, in the pixel unit 41, the pixels 42-1 to 42-8 are arranged over four columns such that pixels 42 in a certain column and pixels 42 in an adjacent column are shifted from each other in a row direction by half pixel. For example, taking the pixel 42-1 as a reference, the pixel 42-5 is arranged below the pixel 42-1 such that the pixels 42-1 and 42-5 are adjacent to each other in a first column. On the other hand, in a second column, the pixel 42-7 is arranged in a position shifted downward relative to the position of the pixel 42-1 by half pixel, the pixel 42-3 is arranged below the pixel 42-7 so as to be adjacent to the pixel 42-7, and the pixel 42-6 is arranged over the pixel 42-7 so as to be adjacent to the pixel 42-7. Furthermore, in a third column, the pixel 42-2 is arranged in a position shifted upward from the pixel 42-7 by half pixel, and the pixel 42-4 is arranged in a position shifted downward from the pixel 42-7 by half pixel. Moreover, in a fourth column, the pixel 42-8 is arranged in a position between the pixels 42-2 and 42-4.

In this way, when the pixel unit 41 is arranged in the light receiving plane of the solid-state image sensor, the pixel unit 41 having the irregular shape covers the entire plane with a simple periodic structure.

Figure 7:
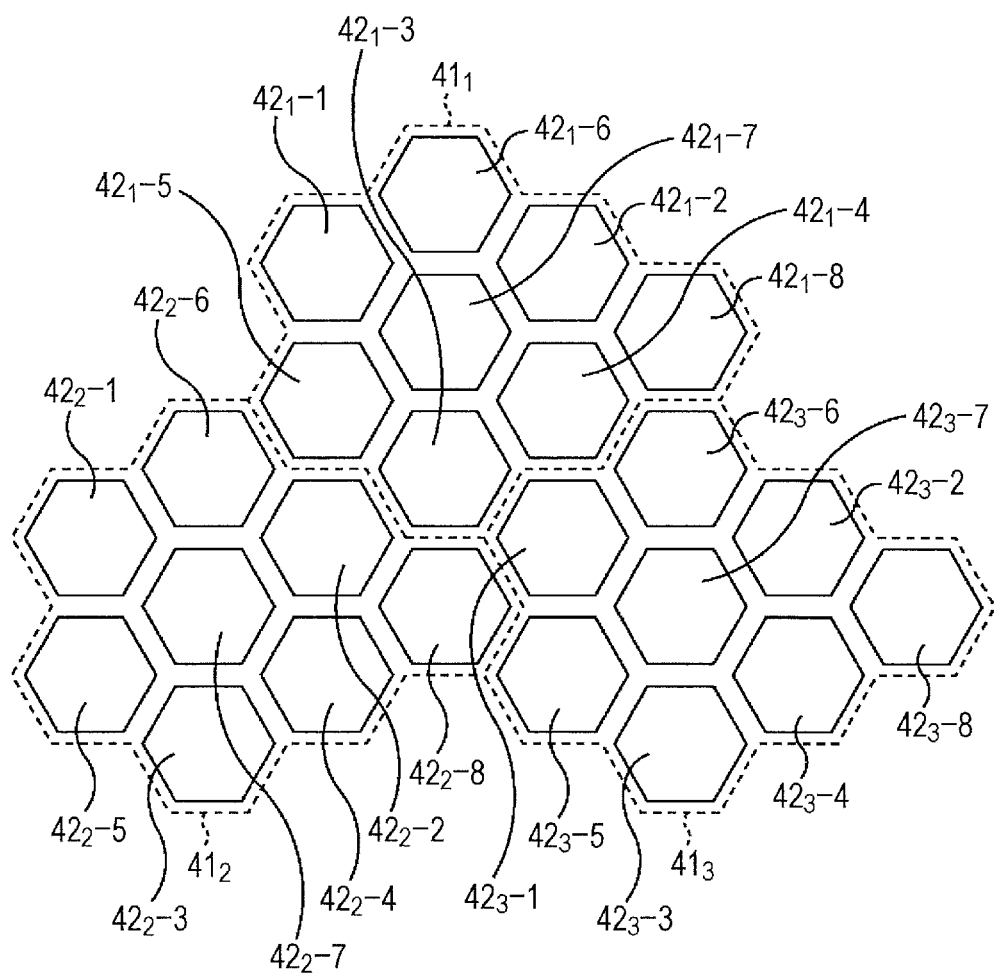
FIG. 7 is a diagram illustrating the pixel units which are periodically arranged.

FIG. 7 is a diagram illustrating three pixel units $41_1$ to $41_3$ which are periodically arranged, for example.

As illustrated in FIG. 7, the pixel units 41 having the simple periodic structure covers the entire plane (such that the pixel units 41 are periodically arranged in row and column directions). By this, in the solid-state image sensor including the pixel unit 41 disposed on the light receiving plane, a plane coverage by the pixels 42 is improved while the pixels 42 corresponding to multiple colors are employed. Furthermore, since the pixel unit 41 is arranged with the simple periodic structure, an image process of generating an image from pixel signals output from the solid-state image sensor is easily performed.

Here, in the pixel unit 41, color filters may be provided for the individual pixels 42-1 to 42-8 so that the pixels 42-1 to 42-8 receive light of colors corresponding to the color filters. Alternatively, in the pixel unit 41, a number of the pixels 42 may not be provided with color filters, and the pixels 42 which are not provided with the color filters may receive light of all wavelengths (hereinafter referred to as "white light" where appropriate).

Furthermore, in the pixel unit 41, a number of the pixels 42-1 to 42-8 (the pixels 42-7 and 42-8, for example) may not be formed, for example. Specifically, the pixel unit 41 may include eight or a smaller number of pixels 42 arranged therein as long as the pixel unit 41 has an outer shape which ensures a region in which the eight pixels 42-1 to 42-8 are arranged.

Figure 8:
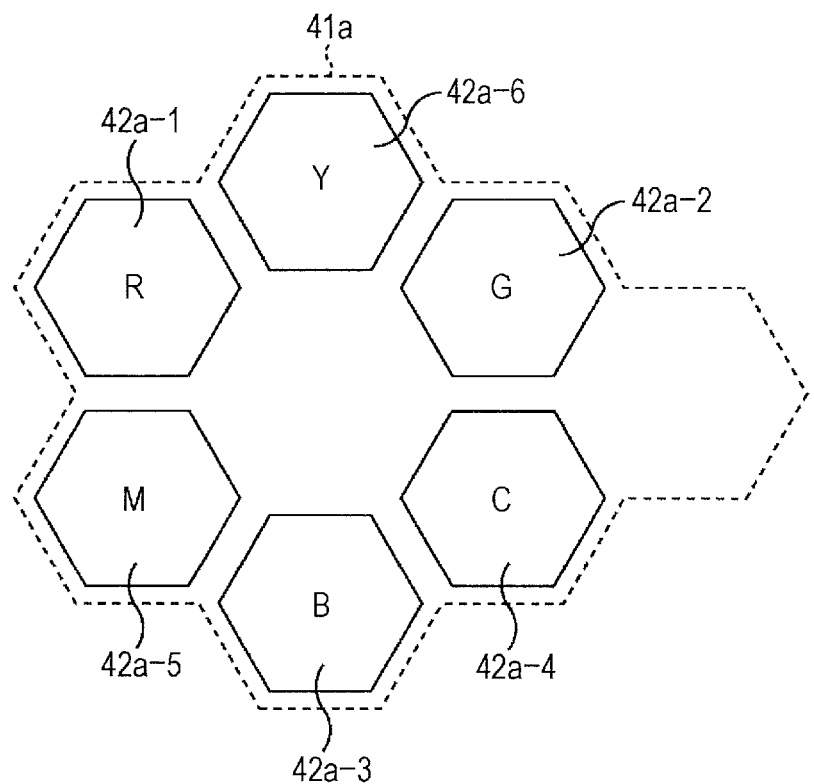
FIG. 8 is a diagram illustrating a configuration of a first arrangement example of a pixel unit including pixels arranged therein.

FIG. 8 is a diagram illustrating a configuration of a pixel unit 41a including pixels 42a arranged as a first arrangement example.

As illustrated in FIG. 8, the pixel unit 41a includes a group of eight pixels 42a-1 to 42a-6. Specifically, in the pixel unit 41a, the pixels 42a are not arranged in portions corresponding to the portions of the pixels 42-7 and 42-8 in the pixel unit 41 illustrated in FIG. 6.

The different pixels 42a-1 to 42a-6 receive light through color filters of different colors, and output pixel signals obtained by converting the corresponding color light into electric signals. For example, the pixel 42a-1 receives red (R) light, the pixel 42a-2 receives green (G) light, and the pixel 42a-3 receives blue (B) light. Furthermore, the pixel 42a-4 receives cyan (C) light, the pixel 42a-5 receives magenta (M) light, and the pixel 42a-6 receives yellow (Y) light. As described above, the pixels 42a-1 to 42a-6 are arranged such that pairs of the pixels 42a which have complementary colors relative to each other are diagonally arranged. With this arrangement, when a defect occurs in one of the pixels 42a and correction is performed on the defect pixel 42a, for example, false color is prevented from being generated.

Furthermore, as with the case of the pixel unit 21 illustrated in FIG. 3, the pixel unit 41a may employ the pixel sharing structure.

Figure 9:
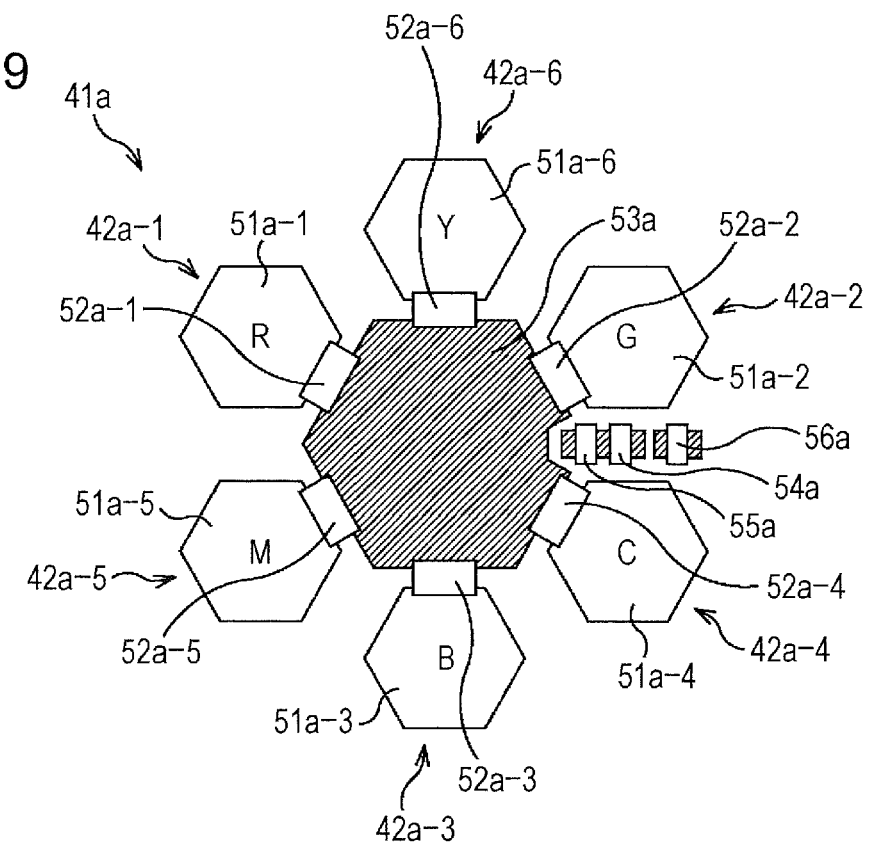
FIG. 9 is a diagram illustrating a first configuration of the pixel unit of the first arrangement example.

Referring to FIG. 9, a first configuration of the pixel unit 41a will be described.

As illustrated in FIG. 9, the pixel unit 41a includes photoelectric conversion elements 51a-1 to 51a-6 and transfer gates 52a-1 to 52a-6 which are included in the pixels 42a-1 to 42a-6, respectively, an FD 53a, an amplification transistor 54a, a selection transistor 55a, and a reset transistor 56a which are shared by the pixels 42a-1 to 42a-6.

The photoelectric conversion elements 51a-1 to 51a-6 which are photodiodes or photoelectric conversion films generate charges by receiving light which is transmitted through on-chip lenses, not shown, and store the charges. Furthermore, the photoelectric conversion elements 51a-1 to 51a-6 have hexagonal outer shapes so as to correspond to the shapes of the pixels 42a-1 to 42a-6. Note that the on-chip lenses are arranged so as to contact with hexagons which are a shape of the photoelectric conversion elements 51a from an inside or an outside.

The transfer gates 52a-1 to 52a-6 are arranged such that the photoelectric conversion elements 51a-1 to 51a-6 and the FD 53a are connected to each other through the transfer gates 52a-1 to 52a-6. When the transistors serving as the transfer gates 52a-1 to 52a-6 are turned on, the charges stored in the photoelectric conversion elements 51a-1 to 51a-6 are transferred to the FD 53a.

The FD 53a stores the charges transferred from the photoelectric conversion elements 51a-1 to 51a-6 through the transfer gates 52a-1 to 52a-6 at different timings. Furthermore, as illustrated in FIG. 9, the FD 53a is formed in a region surrounded by the photoelectric conversion elements 51a-1 to 51a-6. Specifically, a pixel is not formed in a region of the pixel unit 41a corresponding to the region in which the pixel 42-7 is formed in the pixel unit 41 in FIG. 6 but the FD 53a is formed in the region. As described above, since the large FD 53a is disposed, capacity for storing the charge of the FD 53a is increased. For example, even when the photoelectric conversion elements 51a-1 to 51a-6 receive a large amount of light, the charge stored in the FD 53a is prevented from overflowing.

The amplification transistor 54a amplifies the charge stored in the FD 53a, the selection transistor 55a connects the amplification transistor 54a to a signal line which outputs pixel signals, and the reset transistor 56a resets the charge stored in the FD 53a.

Since, in the pixel unit 41a configured as described above, six color light beams are received by the pixels 42a-1 to 42a-6 and pixel signals are output, color reproducibility is improved. Furthermore, since the pixels 42a-1 to 42a-6 share the FD 53a, the amplification transistor 54a, the selection transistor 55a, and the reset transistor 56a, a large area for the photoelectric conversion elements 51a may be obtained. By this, characteristics of the pixels 42a-1 to 42a-6 are improved.

Furthermore, as with the case of FIG. 7, when the pixel unit 41a is arranged in the light receiving plane of the solid-state image sensor, the pixel unit 41a covers the entire plane with a simple periodic structure.

Figure 10:
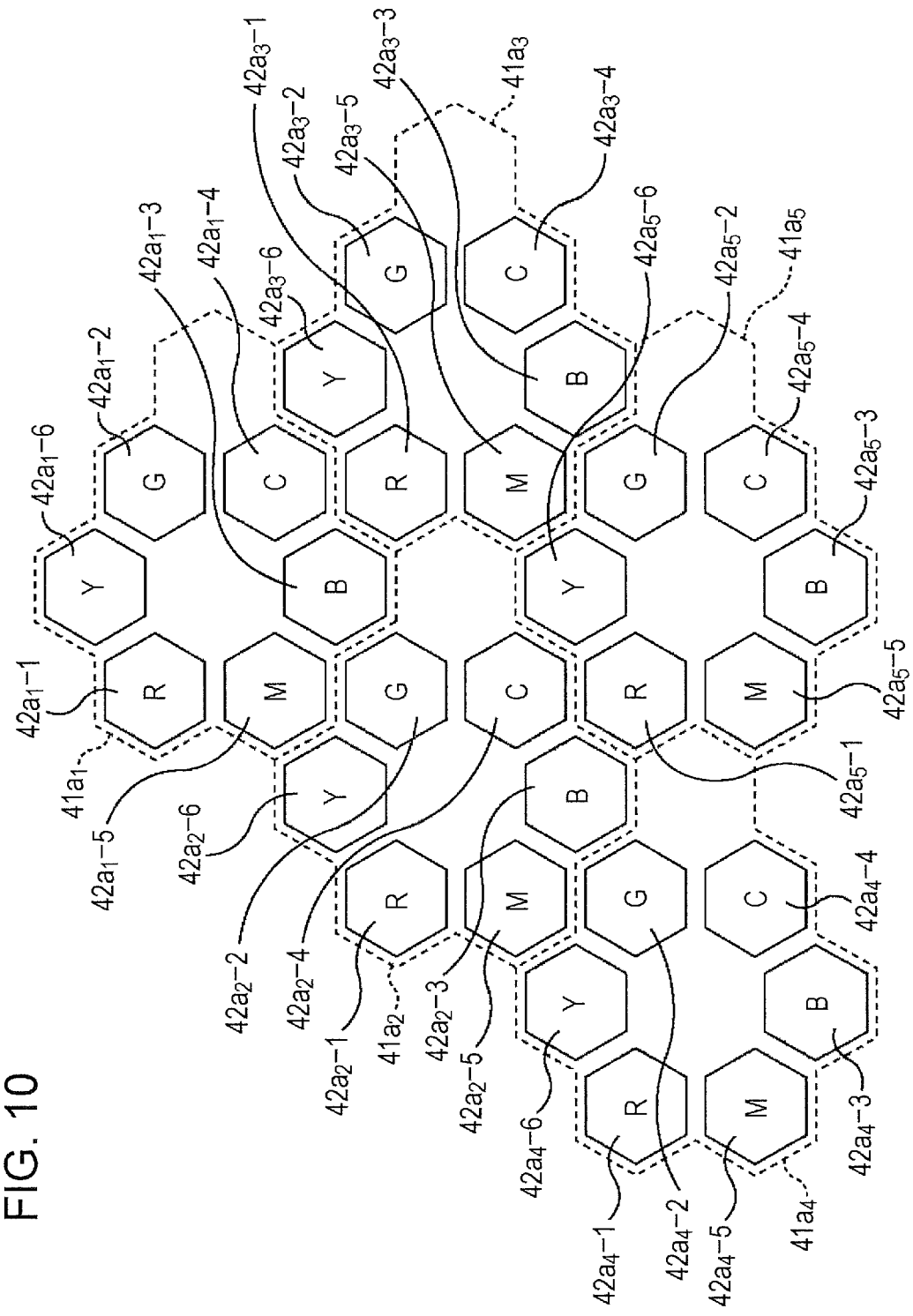
FIG. 10 is a diagram illustrating the pixel units which are periodically arranged in the first arrangement example.

FIG. 10 is a diagram illustrating five pixel units $41a_1$ to $41a_5$ which are periodically arranged, for example. As illustrated in FIG. 10, the pixel unit 41a may cover the entire plane with the simple periodic structure in which the pixels 42a-1 to 42a-6 are periodically arranged.

Furthermore, as a configuration of the pixel unit 41a, as with the case of FIG. 5, the FD 53a may be shared by a predetermined number of pixels 42a or the FDs 53a may be provided for individual pixels 42a.

Figure 11A:
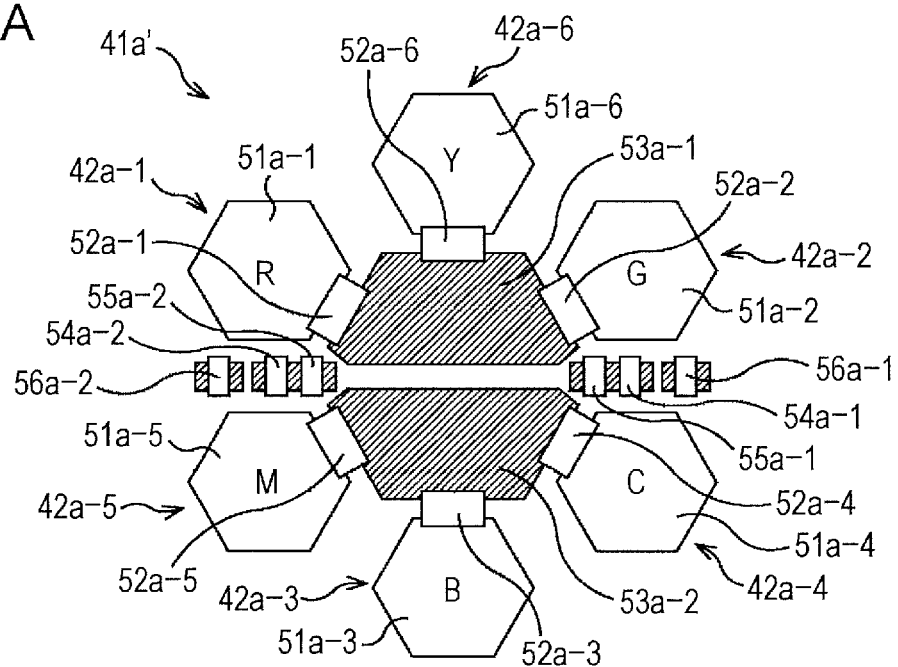
FIGS. 11A and 11B are diagrams illustrating second and third configurations of the pixel unit of the first arrangement example.
Figure 11B:
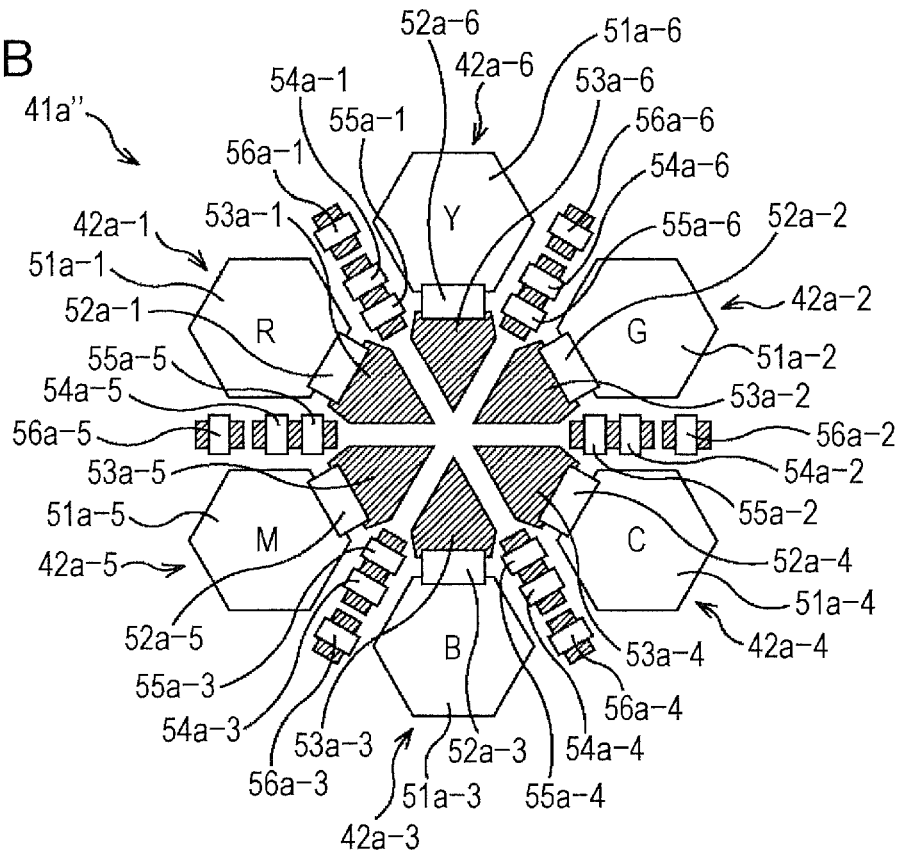

FIGS. 11A and 11B are diagrams illustrating second and third configurations of the pixel unit 41a. Note that, in FIGS. 11A and 11B, configurations the same as those of the pixel unit 41a of FIG. 9 are denoted by reference numerals the same as those of the pixel unit 41a of FIG. 9, and detailed descriptions thereof are omitted.

A pixel unit 41a' illustrated in FIG. 11A includes photoelectric conversion elements 51a-1 to 51a-6, transfer gates 52a-1 to 52a-6, FDs 53a-1 and 53a-2, amplification transistors 54a-1 and 54a-2, selection transistors 55a-1 and 55a-2, and reset transistors 56a-1 and 56a-2.

As with the pixel unit 21' of FIG. 5A, in the pixel unit 41a', the three pixels 42a-1, 42a-2, and 42a-6 share the FD 53a-1, the amplification transistor 54a-1, the selection transistor 55a-1, and the reset transistor 56a-1. Furthermore, in the pixel unit 21a', the three pixels 42a-3, 42a-4, and 42a-5 share the FD 53a-2, the amplification transistor 54a-2, the selection transistor 55a-2, and the reset transistor 56a-2.

Note that the pixel unit 41a' may include three FDs 53a and each of the FDs 53a may be shared by two of the pixels 42a.

A pixel unit 41a" illustrated in FIG. 11B includes photoelectric conversion elements 51a-1 to 51a-6, transfer gates 52a-1 to 52a-6, FDs 53a-1 to 53a-6, amplification transistors 54a-1 and 54a-6, selection transistors 55a-1 and 55a-6, and reset transistors 56a-1 and 56a-6.

As with the pixel unit 21" of FIG. 5B, in the pixel unit 41a", the FDs 53a are not shared and the pixels 42a-1 to 42a-6 are individually driven.

Figure 12:
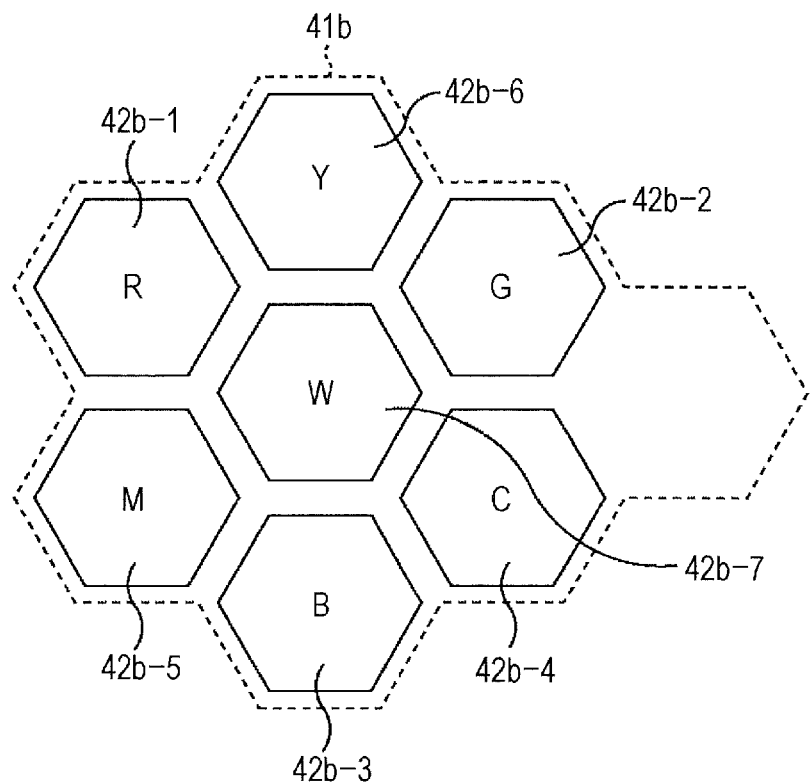
FIG. 12 is a diagram illustrating a configuration of a second arrangement example of a pixel unit including pixels arranged therein.

FIG. 12 is a diagram illustrating a configuration of a pixel unit 41b including pixels 42 arranged as a second arrangement example.

As illustrated in FIG. 12, a pixel unit 41b includes a group of seven pixels 42b-1 to 42b-7. Specifically, in the pixel unit 41b, the pixel 42b is not arranged in a portion corresponding to the portion of the pixel 42-8 in the pixel unit 41 illustrated in FIG. 6.

Furthermore, as with the pixels 42a-1 to 42a-6 of FIG. 8, the pixels 42b-1 to 42b-6 receive light of respective colors, and the pixel 42b-7 receives white (W) light. Specifically, in the pixel unit 41b, the pixels 42b-1 to 42b-6 are arranged so as to surround an outer circumference of the pixel 42b-7 which receives the white light such that the pixel 42b-7 is positioned in the center and pairs of the pixels 42b which have complementary colors relative to each other are diagonally arranged. With this arrangement, when a defect occurs in one of the pixels 42 and correction is performed on the pixel 42b, for example, false color is prevented from being generated.

Note that, when the pixel 42b-7 which receives the white light is used, the red pixel signal R, the green pixel signal G, and the blue pixel signal B may be synthesized using the white pixel signal W in addition to Expression (1) to Expression (3).

Specifically, the red pixel signal R may be obtained using the magenta pixel signal M, the yellow pixel signal Y, and the white pixel signal W in accordance with Expression (7) below. Similarly, the green pixel signal G may be obtained using the cyan pixel signal C, the yellow pixel signal Y, and the white pixel signal W in accordance with Expression (8) below. Furthermore, the blue pixel signal B may be obtained using the cyan pixel signal C, the magenta pixel signal M, and the white pixel signal W in accordance with Expression (9) below.

$$R=Y+M-W \tag{7}$$

$$G=C+Y-W \tag{8}$$

$$B=C+M-W \tag{9}$$

Note that, the pixel signals may be synthesized by weighting also when Expression (7) to Expression (9) are calculated where appropriate. Furthermore, a white pixel signal W may also be synthesized by one of a red pixel signal R, a green pixel signal G, and a blue pixel signal B a cyan pixel signal C, a magenta pixel signal M, and yellow pixel signal Y.

Furthermore, as with the case of the pixel unit 41a illustrated in FIG. 9, the pixel unit 41b may employ the pixel sharing structure.

Figure 13:
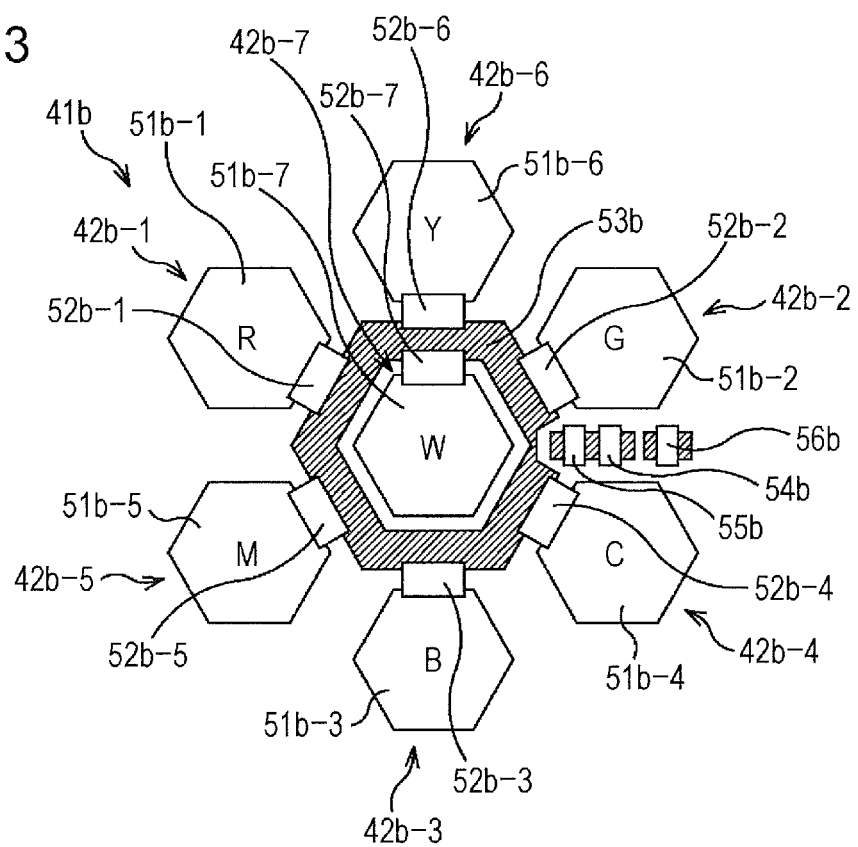
FIG. 13 is a diagram illustrating a first configuration of the pixel unit of the second arrangement example.

As illustrated in FIG. 13, the pixel unit 41b includes photoelectric conversion elements 51b-1 to 51b-7 and transfer gates 52b-1 to 52b-7 which are included in the pixels 42b-1 to 42b-7, respectively, an FD 53b, an amplification transistor 54b, a selection transistor 55b, and a reset transistor 56b which are shared by the pixels 42b-1 to 42b-7. Furthermore, the on-chip lenses which collect light onto the photoelectric conversion elements 51b-1 to 51b-7 are arranged so as to contact with hexagons which are a shape of the photoelectric conversion elements 51b from an inside or an outside.

The photoelectric conversion elements 51b-1 to 51b-6 and the transfer gates 52b-1 to 52b-6 have configuration similar to those of the photoelectric conversion elements 51a-1 to 51a-6 and the transfer gates 52a-1 to 52a-6. The photoelectric conversion element 51b-7 is arranged in the center so as to be surrounded by the photoelectric conversion elements 51b-1 to 51b-6, and the transfer gate 52b-7 is arranged so as to connect the photoelectric conversion element 51b-7 and the FD 53b to each other.

The FD 53b stores charges transferred from the photoelectric conversion elements 51b-1 to 51b-7 through the transfer gates 52b-1 to 52b-7 at different timings. Note that, as illustrated in FIG. 13, the FD 53b is formed in a region between the photoelectric conversion element 51b-7 and the photoelectric conversion elements 51b-1 to 51b-6 so as to surround the photoelectric conversion element 51b-7.

Furthermore, the amplification transistor 54b, the selection transistor 55b, and the reset transistor 56b are configured similarly to the amplification transistor 54a, the selection transistor 55a, and the reset transistor 56a illustrated in FIG. 9.

Since, in the pixel unit 41b configured as described above, seven color light beams are received by the pixels 42b-1 to 42b-7 and pixel signals are output, color reproducibility is improved. Furthermore, since the pixels 42b-1 to 42b-7 share the FD 53b, the amplification transistor 54b, the selection transistor 55b, and the reset transistor 56b, a large area for the photoelectric conversion elements 51b may be realized. By this, characteristics of the pixels 42b-1 to 42b-7 are improved.

Furthermore, as with the case of FIG. 7, when the pixel units 41b is arranged in the light receiving plane of the solid-state image sensor, the pixel units 41b covers the entire plane with a simple periodic structure.

Figure 14:
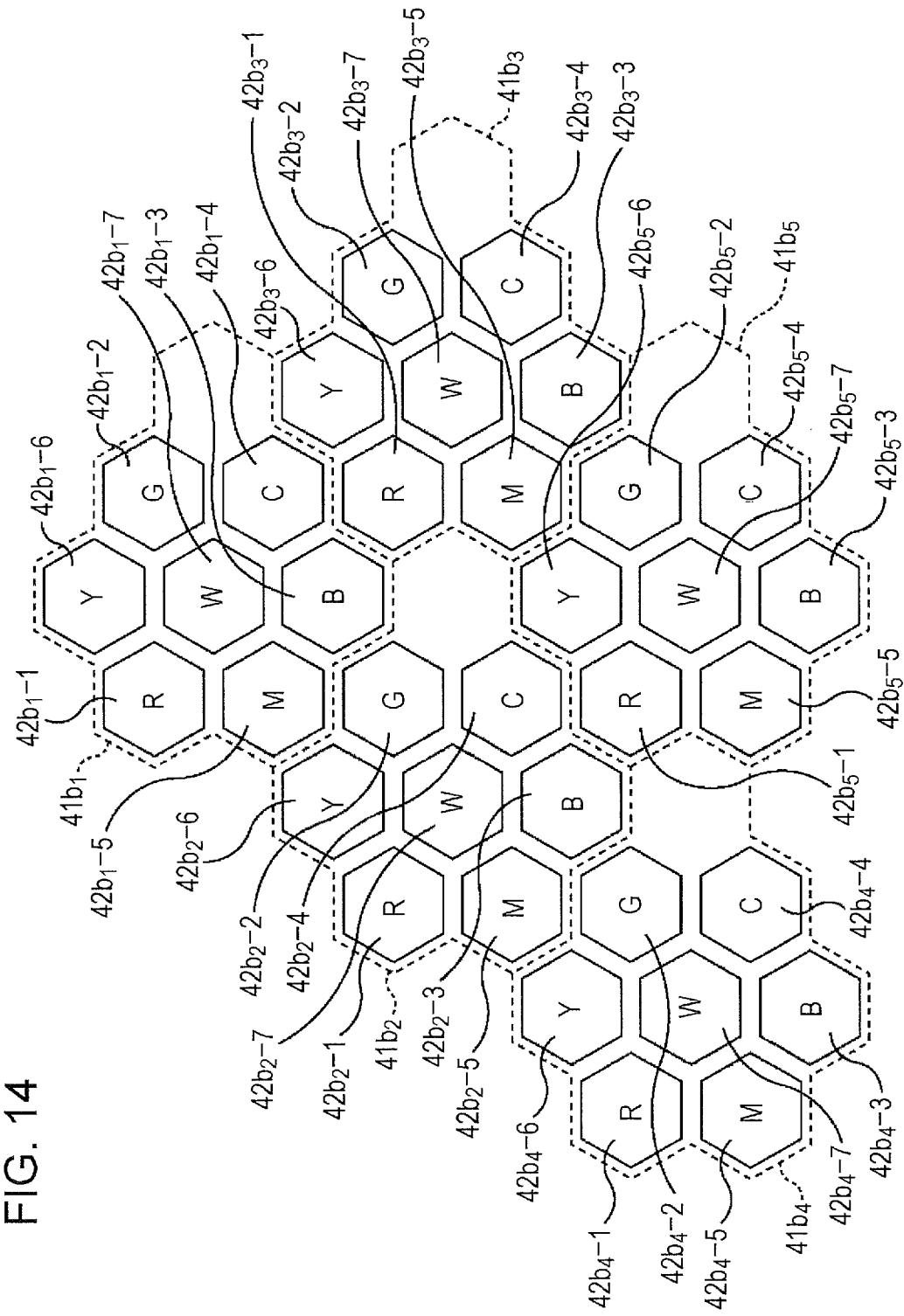
FIG. 14 is a diagram illustrating the pixel units which are periodically arranged in the second arrangement example.

FIG. 14 is a diagram illustrating five pixel units 41b$_1$ to 41b$_5$ which are periodically arranged, for example. As illustrated in FIG. 14, the pixel units 41b may cover the entire plane with the simple periodic structure in which the pixels 42b$_1$-1 to 42b$_1$-7 are periodically arranged.

Furthermore, as a configuration of the pixel unit 41b, as with the case of FIG. 11, the FD 53b may be shared by a predetermined number of pixels 42b or the FDs 53b may be provided for individual pixels 42b.

Figure 15A:
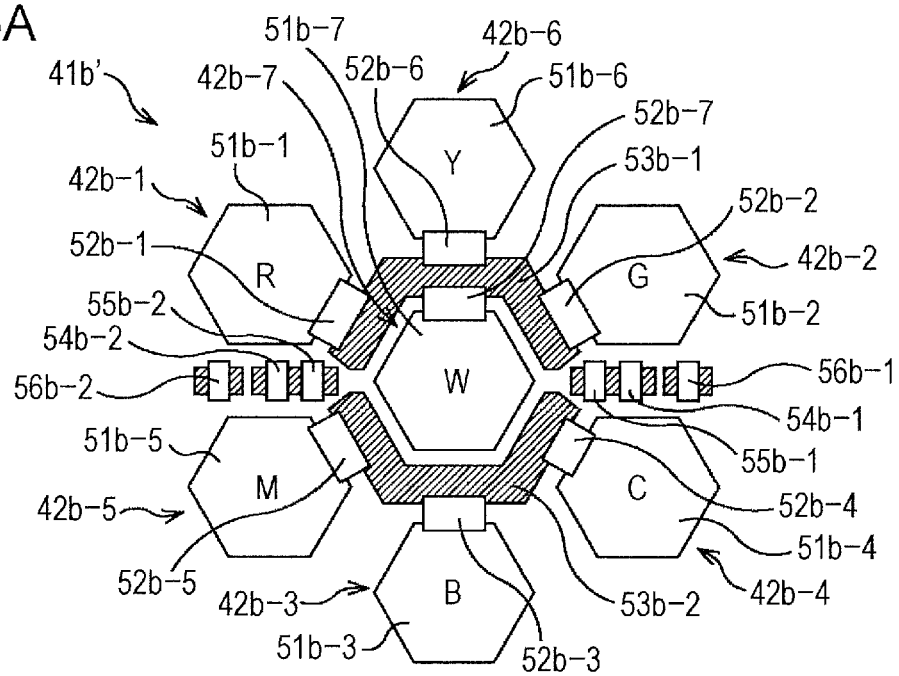
FIGS. 15A and 15B are diagrams illustrating second and third configurations of the pixel unit of the second arrangement example.
Figure 15B:
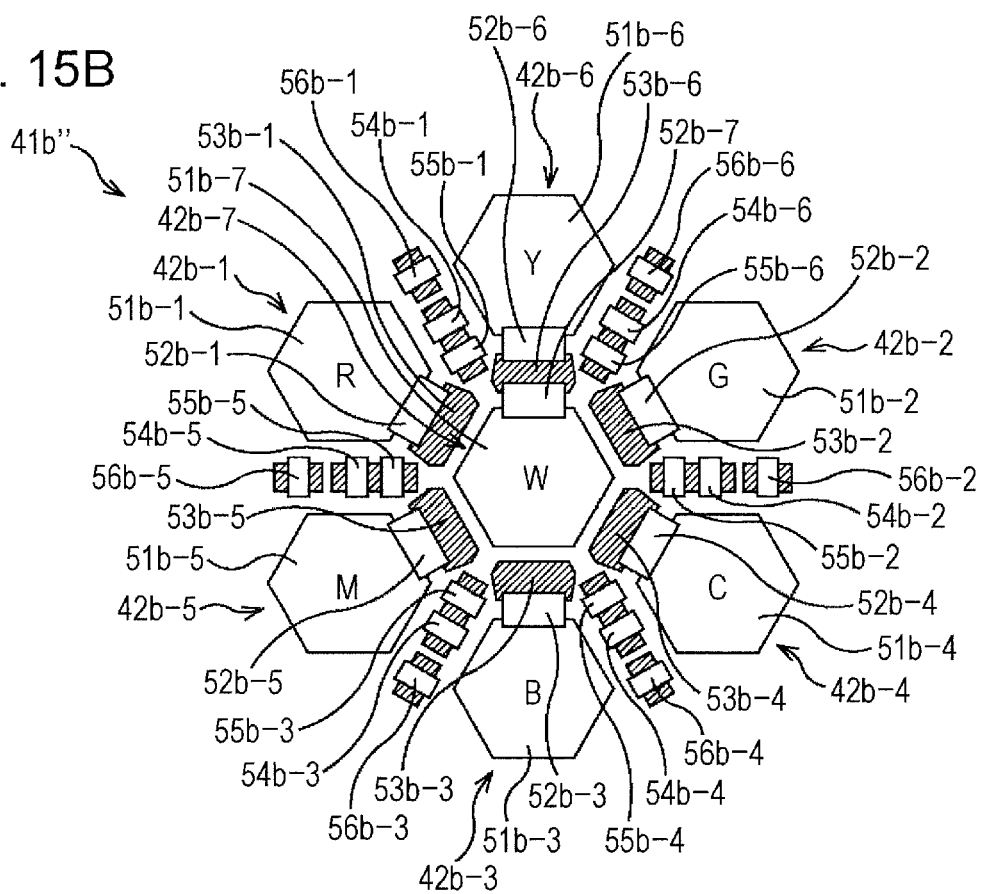

FIGS. 15A and 15B are diagrams illustrating second and third configurations of the pixel unit 41b. Note that, in FIGS. 15A and 15B, configurations the same as those of the pixel unit 41b of FIG. 13 are denoted by reference numerals the same as those of FIG. 13, and detailed descriptions thereof are omitted.

A pixel unit 41b' illustrated in FIG. 15A includes photoelectric conversion elements 51b-1 to 51b-7, transfer gates 52b-1 to 52b-7, FDs 53b-1 and 53b-2, amplification transistors 54b-1 and 54b-2, selection transistors 55b-1 and 55b-2, and reset transistors 56b-1 and 56b-2.

Furthermore, in the pixel unit 41b', the four pixels 42b-1, 42b-2, 42b-6, and 42b-7 share the FD 53b-1, the amplification transistor 54b-1, the selection transistor 55b-1, and the reset transistor 56b-1. Furthermore, in the pixel unit 21b', the three pixels 42b-3, 42b-4, and 42b-5 share the FD 53b-2, the amplification transistor 54b-2, the selection transistor 55b-2, and the reset transistor 56b-2.

Note that the pixel unit 41b' may include three FDs 53b and each of the FDs 53b may be shared by two of the pixels 42b and three of the pixels 42b.

A pixel unit 41b" illustrated in FIG. 15B includes photoelectric conversion elements 51b-1 to 51b-7, transfer gates 52b-1 to 52b-7, FDs 53b-1 to 53b-6, amplification transistors 54b-1 and 54b-6, selection transistors 55b-1 and 55b-6, and reset transistors 56b-1 and 56b-6.

In the pixel unit 41b", the photoelectric conversion elements 51b-6 and 51b-7 share the FD 53b-6, and the pixels 42b-1 to 42b-5 use the corresponding FD 53b-1 to 53b-5.

Figure 16:
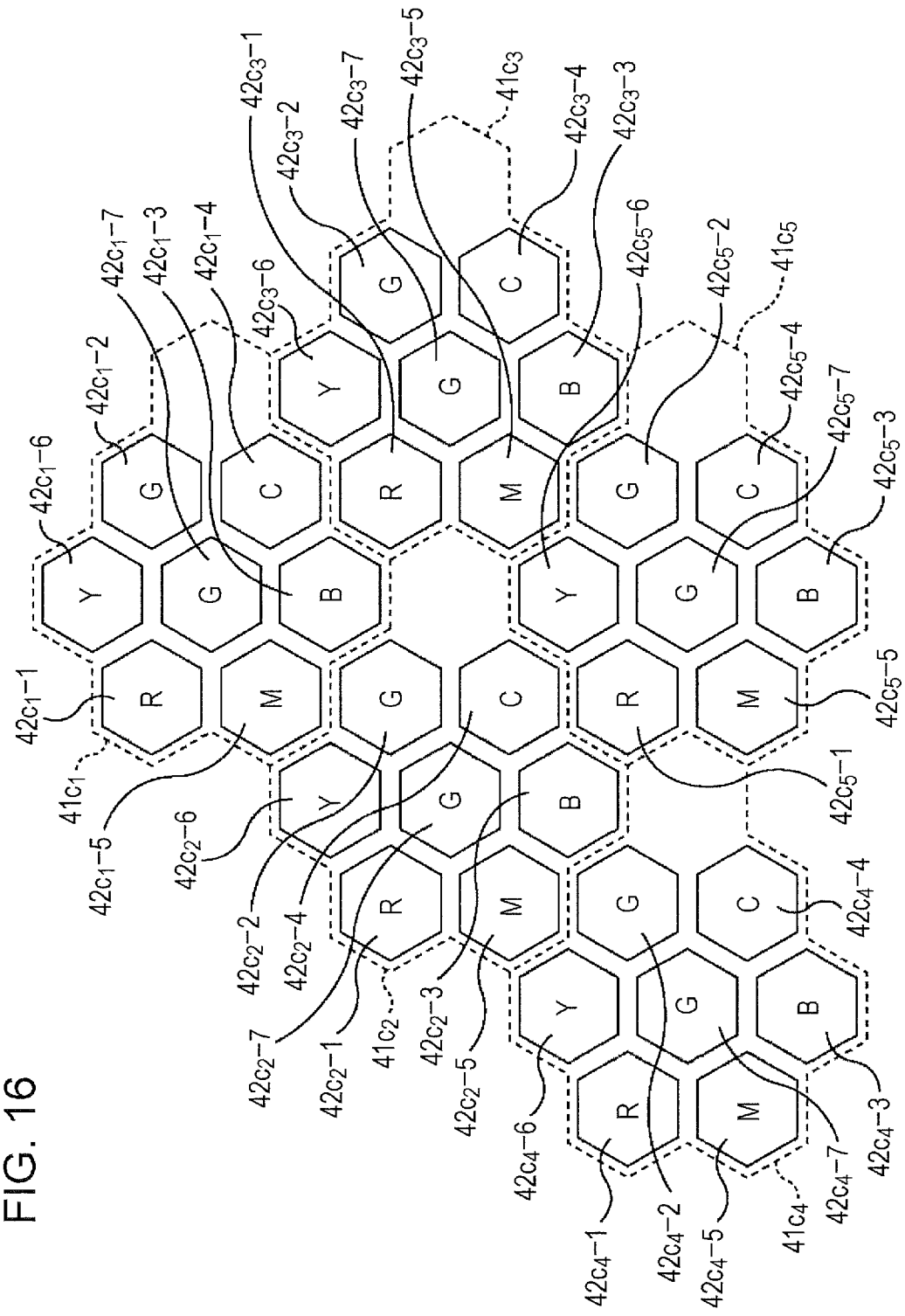

FIG. 16 is a diagram illustrating a configuration of a pixel units 41c including pixels 42c arranged as a third arrangement example. In FIG. 16, five pixel units 41c$_1$ to 41c$_5$ are periodically arranged.

As illustrated in FIG. 16, the pixel unit 41c has a configuration the same as that of the pixel unit 41b of FIG. 12 in that the pixel unit 41c includes a group of seven pixels 42c-1 to 42c-7. Note that the pixel unit 41c has the configuration different from that of the pixel unit 41b of FIG. 12 in that the pixel 42c-7 receives green light.

Specifically, in the pixel unit 41c, the two pixels 42c-2 and 42c-7 receive green light. Accordingly, resolution of the green light is improved. Furthermore, the pixel unit 41c covers an entire plane with the simple periodic structure in which the pixels 42c-1 to 42c-7 are periodically arranged.

Furthermore, in the pixel unit 41c, as with the case of the pixel unit 41b of FIG. 12, when a defect occurs in one of the pixels 42c and correction is performed on the defect pixel 42c, for example, false color is prevented from being generated. Furthermore, the pixel unit 41c may employ the pixel sharing structure described above with reference to FIGS. 13, 15A, and 15B.

Figure 17:
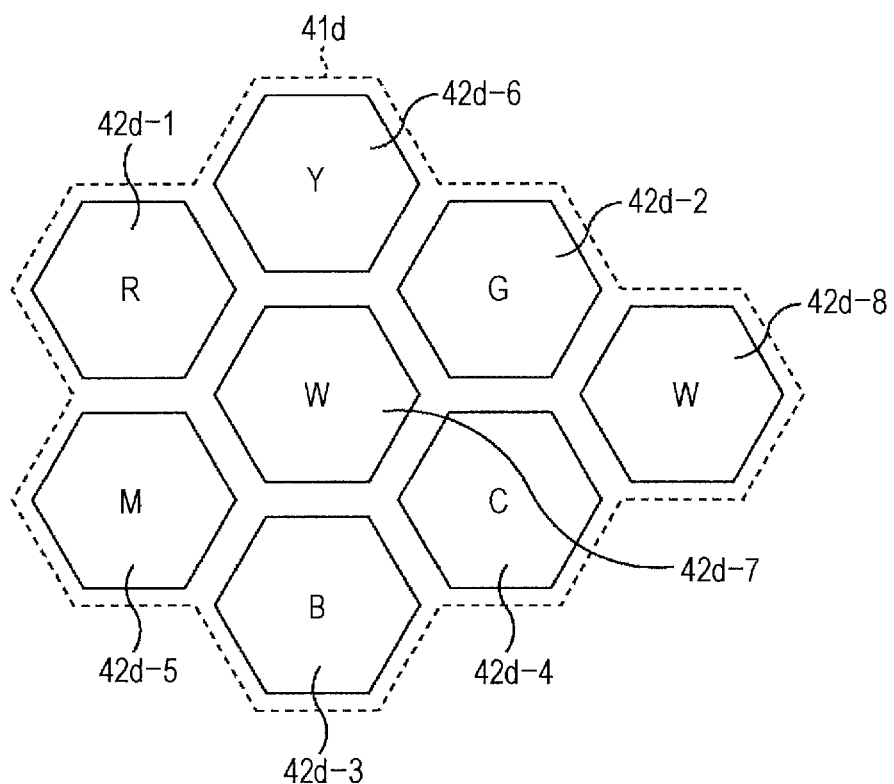
FIG. 17 is a diagram illustrating a configuration of a fourth arrangement example of a pixel unit including pixels arranged therein.

FIG. 17 is a diagram illustrating a configuration of a pixel unit 41d including the pixels 42 arranged as a fourth arrangement example.

As illustrated in FIG. 17, the pixel unit 41d includes a group of eight pixels 42d-1 to 42d-8.

Furthermore, as with the pixels 42b-1 to 42b-7 of FIG. 12, the pixels 42d-1 to 42d-7 receive light of respective colors and the pixel 42d-8 receives white (W) light. Specifically, in the pixel unit 41d, the pixels 42d-1 to 42d-6 are arranged so as to surround an outer circumference of the pixel 42d-7 which receives the white light such that the pixel 42d-7 is positioned in the center and the pixels 42d which have complementary colors relative to each other are diagonally arranged. With this arrangement, when a defect occurs in one of the pixels 42d and correction is performed on the defect pixel 42d, for example, false color is prevented from being generated.

Furthermore, in the pixel unit 41d, the two pixels 42d-7 and 42d-8 receive white light. Accordingly, resolution for brightness is improved.

Furthermore, as with the case of the pixel unit 41a illustrated in FIG. 9, the pixel unit 41d may employ the pixel sharing structure.

Figure 18:
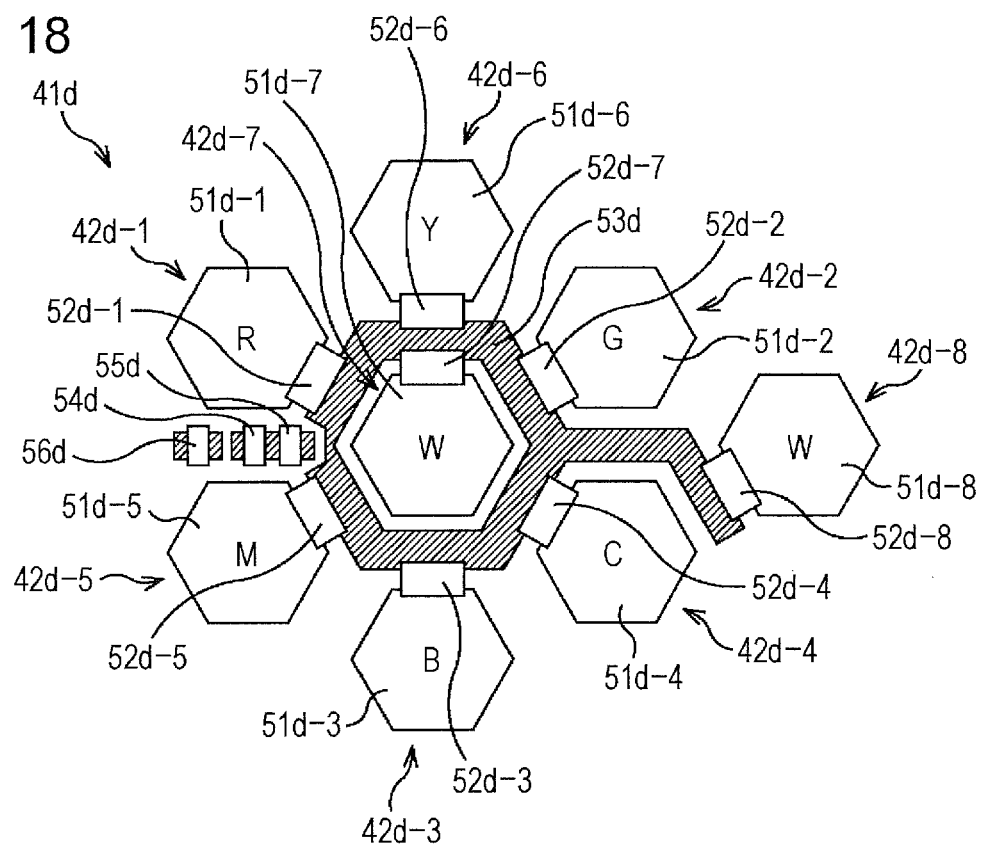
FIG. 18 is a diagram illustrating a first configuration of the pixel unit of the fourth arrangement example.

As illustrated in FIG. 18, the pixel unit 41d includes photoelectric conversion elements 51d-1 to 51d-8 and transfer gates 52d-1 to 52d-8 which are included in the pixels 42d-1 to 42d-8, respectively, an FD 53d, an amplification transistor 54d, a selection transistor 55d, and a reset transistor 56d which are shared by the pixels 42d-1 to 42d-8.

The photoelectric conversion elements 51d-1 to 51d-7 and the transfer gates 52d-1 to 52d-7 have configurations similar to those of the photoelectric conversion elements 51b-1 to 51b-7 and the transfer gates 52b-1 to 52b-7 illustrated in FIG. 13. The photoelectric conversion element 51d-8 is arranged outside of a block including the photoelectric conversion elements 51d-1 to 51d-7, and the transfer gate 52d-8 is arranged so as to connect the photoelectric conversion element 51d-8 and the FD 53d to each other.

The FD 53d stores charges transferred from the photoelectric conversion elements 51d-1 to 51d-8 through the transfer gates 52d-1 to 52d-8 at different timings. Note that, as illustrated in FIG. 18, the FD 53d is formed in a region between the photoelectric conversion element 51d-7 and the photoelectric conversion elements 51d-1 to 51d-6 and a region extending from a portion between the photoelectric conversion elements 51d-2 and 51d-4 to a portion in the vicinity of the photoelectric conversion element 51d-8.

Furthermore, the amplification transistor 54d, the selection transistor 55d, and the reset transistor 56d are configured similarly to the amplification transistor 54b, the selection transistor 55b, and the reset transistor 56b illustrated in FIG. 13.

Since, in the pixel unit 41d configured as described above, seven color light beams are received by the pixels 42d-1 to 42d-8 and pixel signals are output, color reproducibility may be improved. Furthermore, since the pixels 42d-1 to 42d-8 share the FD 53d, the amplification transistor 54d, the selection transistor 55d, and the reset transistor 56d, a large area for the photoelectric conversion elements 51d may be realized. By this, characteristics of the pixels 42d-1 to 42d-8 are improved.

Furthermore, as with the case of FIG. 7, when the pixel units 41d is arranged in the light receiving plane of the solid-state image sensor, the pixel units 41d covers the entire plane with a simple periodic structure.

Figure 19:
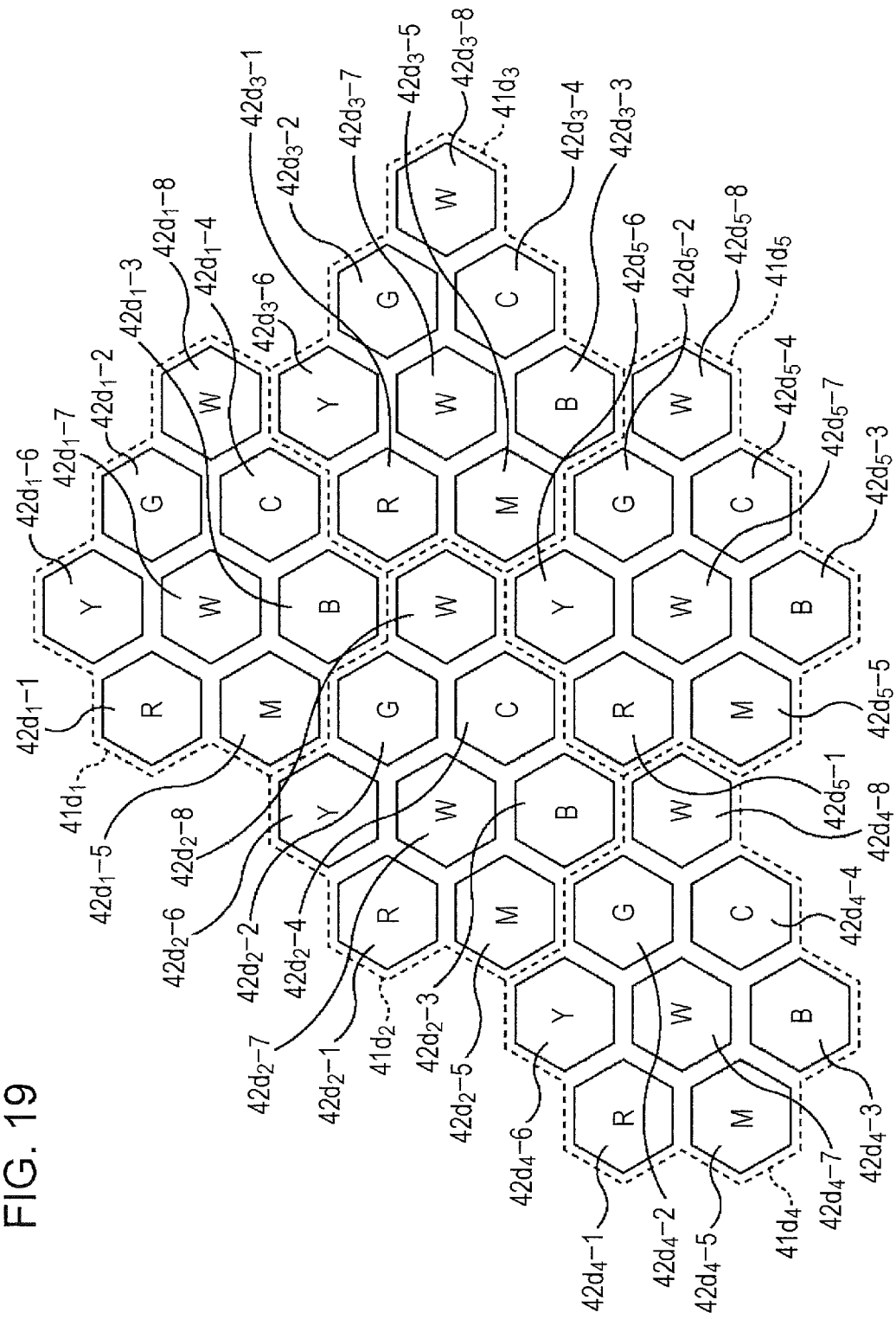
FIG. 19 is a diagram illustrating the pixel units which are periodically arranged in the fourth arrangement example.

FIG. 19 is a diagram illustrating five pixel units 41d$_1$ to 41d$_5$ which are periodically arranged, for example. As illustrated in FIG. 19, the pixel unit 41d may cover the entire plane with a simple periodic structure in which the pixels 42d-1 to 42d-8 are periodically arranged.

Furthermore, as a configuration of the pixel unit 41d, as with the case of FIG. 11, the FD 53d may be shared by a predetermined number of pixels 42d or the FDs 53d may be provided for individual pixels 42d.

Figure 20A:
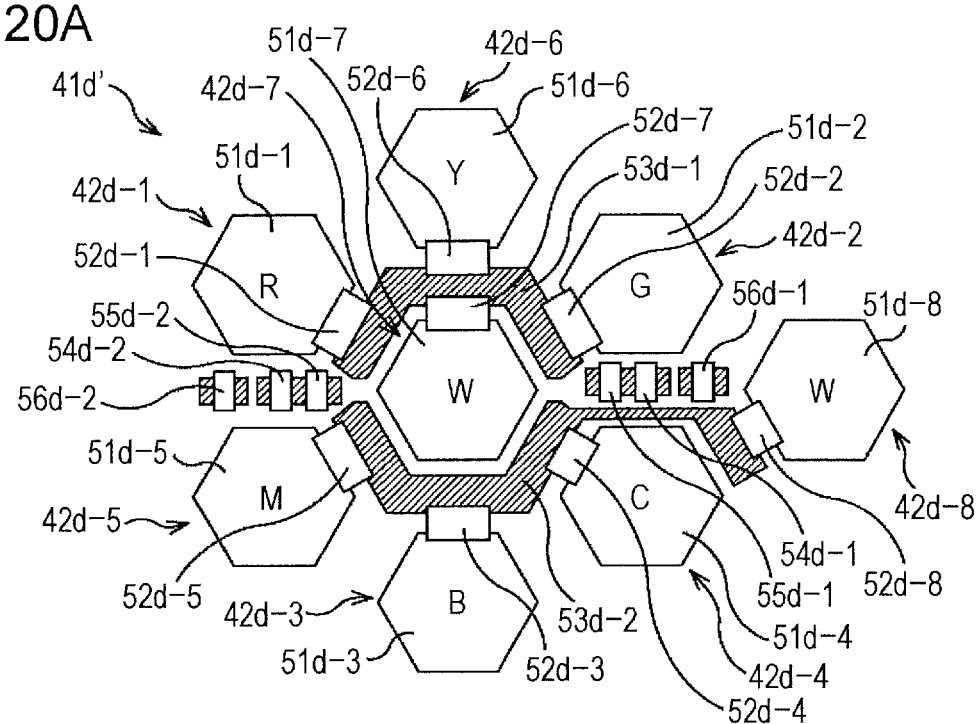
FIGS. 20A and 20B are diagrams illustrating second and third configurations of the pixel unit of the fourth arrangement example.
Figure 20B:
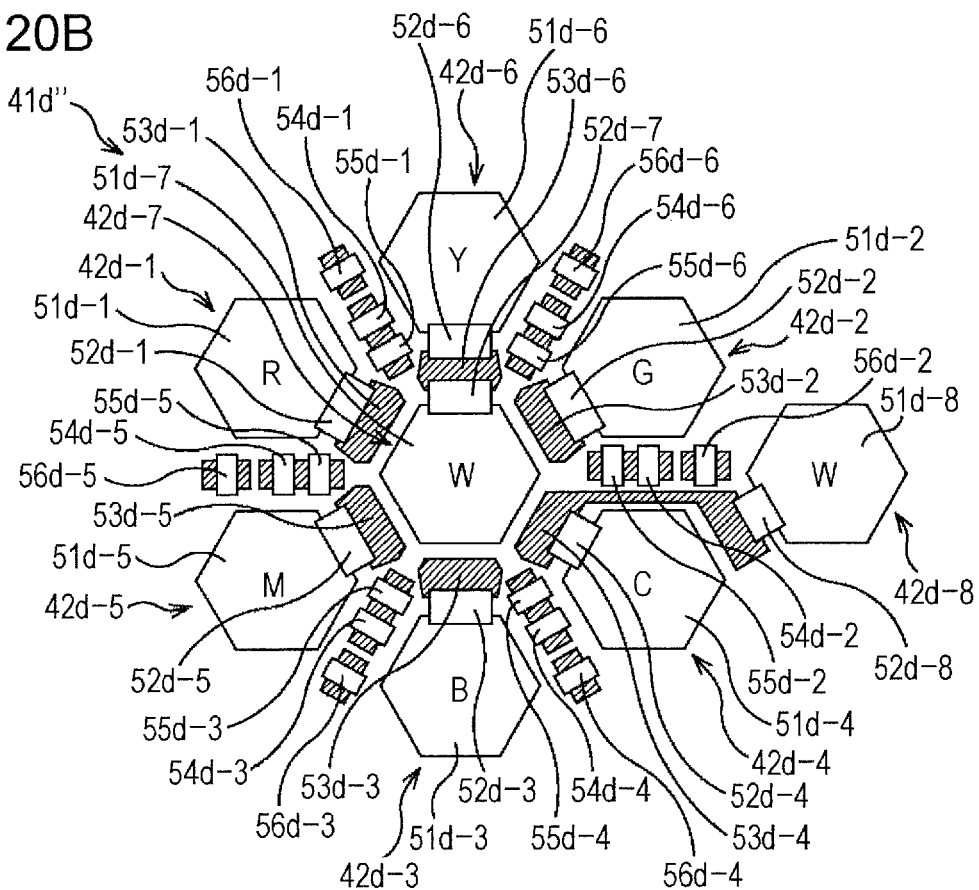

FIGS. 20A and 20B are diagrams illustrating second and third configurations of the pixel unit 41d. Note that, in FIGS. 20A and 20B, configurations the same as those of the pixel unit 41d of FIG. 18 are denoted by reference numerals the same as those of FIG. 18, and detailed descriptions thereof are omitted.

A pixel unit 41d' illustrated in FIG. 20A includes photoelectric conversion elements 51d-1 to 51d-8, transfer gates 52d-1 to 52d-8, FDs 53d-1 and 53d-2, amplification transistors 54d-1 and 54d-2, selection transistors 55d-1 and 55d-2, and reset transistors 56d-1 and 56d-2.

Furthermore, in the pixel unit 41d', the four pixels 42d-1, 42d-2, 42d-6, and 42d-7 share the FD 53d-1, the amplification transistor 54d-1, the selection transistor 55d-1, and the reset transistor 56d-1. Furthermore, in the pixel unit 41d', the three pixels 42d-3, 42d-4, 42d-5, and 42d-8 share the FD 53d-2, the amplification transistor 54d-2, the selection transistor 55d-2, and the reset transistor 56d-2.

Note that the pixel unit 41d' may include four FDs 53d and each of the FDs 53d may be shared by two of the pixels 42d.

A pixel unit 41d" illustrated in FIG. 20B includes photoelectric conversion elements 51d-1 to 51d-8, transfer gates 52d-1 to 52d-8, FDs 53d-1 to 53d-6, amplification transistors 54d-1 to 54d-6, selection transistors 55d-1 to 55d-6, and reset transistors 56d-1 to 56d-6.

In the pixel unit 41d", the photoelectric conversion elements 51d-6 and 51d-7 share the FD 53d-6, the photoelectric conversion elements 51d-4 and 51d-8 share the FD 53d-4, and the pixels 42d-1, 42d-2, 42d-3, and 42d-5 use the corresponding FD 53d-1, FD 53d-2, FD 53d-3, and 53b-5.

Note that the pixel unit 41 may employ an arrangement in which the two pixels 42d-7 and 42d-8 which receive white light in the pixel unit 41d illustrated in FIGS. 17 and 19 receive green light, for example.

Figure 21:
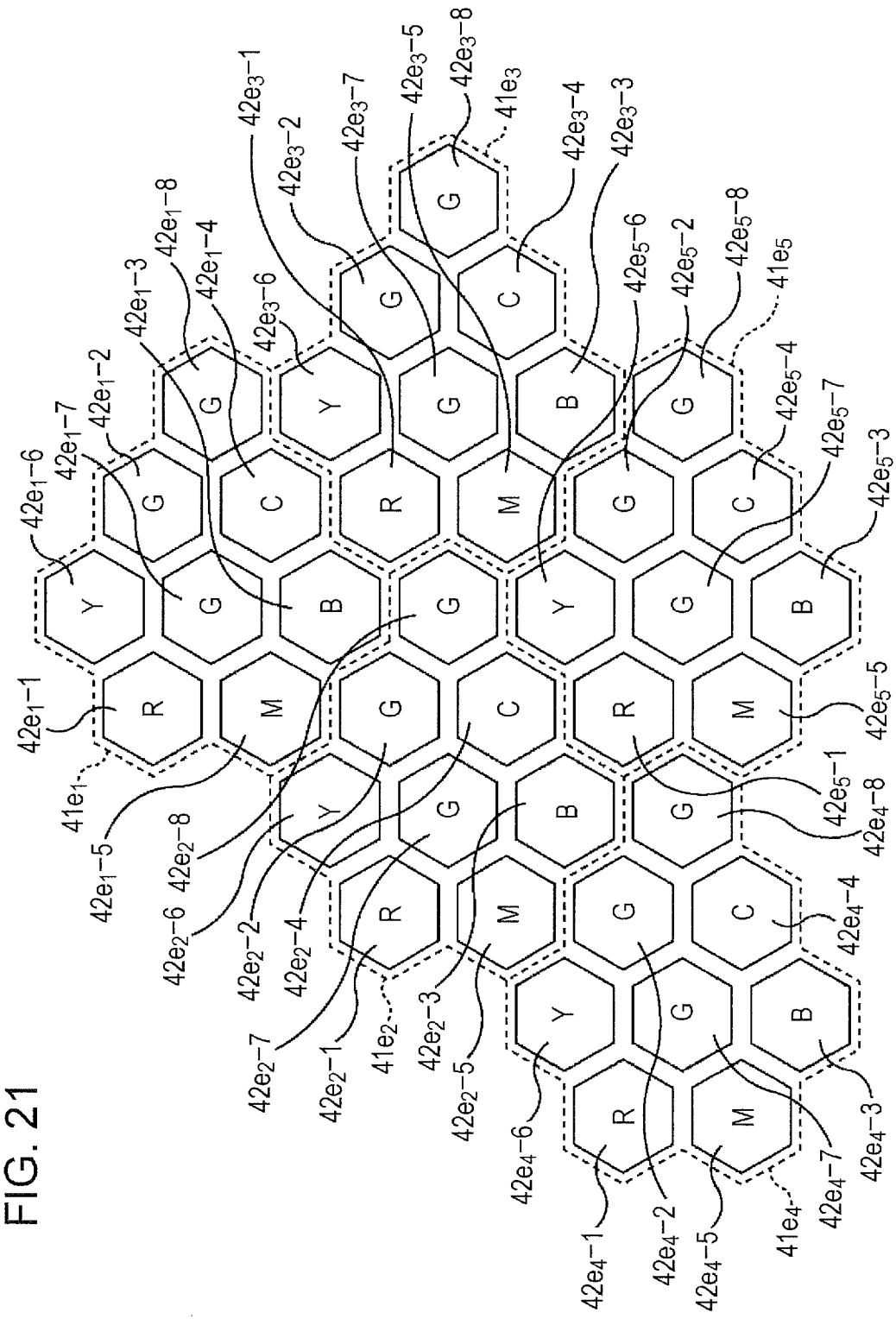
FIG. 21 is a diagram illustrating a configuration of a fifth arrangement example of pixel units including pixels arranged therein.

Specifically, FIG. 21 is a diagram illustrating a configuration of a pixel unit 41e including pixels 42e arranged as a fifth arrangement example. The pixel unit 41e is different from the pixel unit 41d illustrated in FIGS. 17 and 19 in that the pixels 42e-7 and 42e-8 receive green light. Accordingly, resolution of the green light is improved.

Furthermore, the pixel unit 41 may employ an arrangement in which the pixel 42d-8 which receives white light in the pixel unit 41d illustrated in FIGS. 17 and 19 receive green light, for example.

Figure 22:
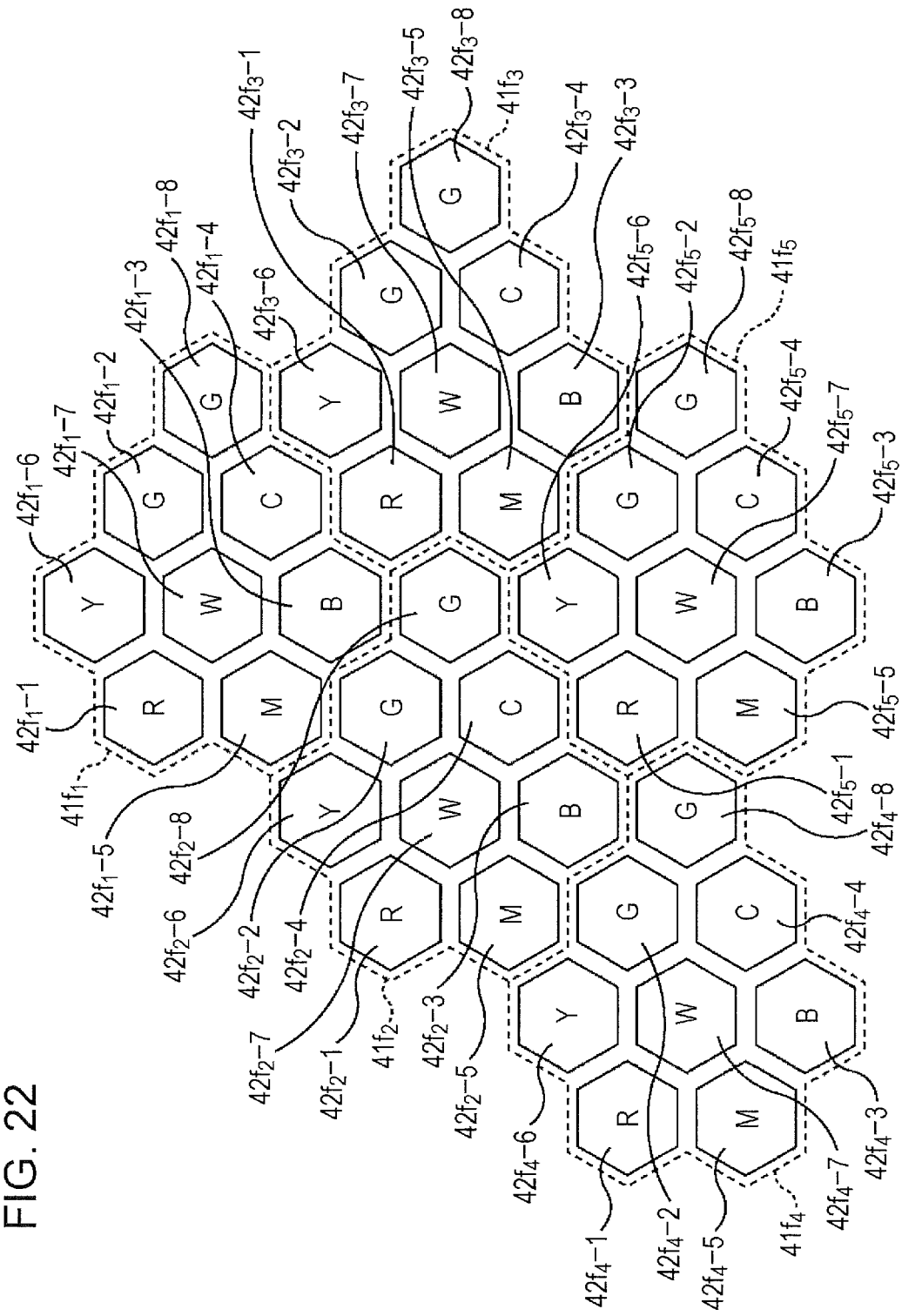
FIG. 22 is a diagram illustrating a configuration of a sixth arrangement example of pixel units including pixels arranged therein.

Specifically, FIG. 22 is a diagram illustrating a configuration of a pixel unit 41f including pixels 42f arranged as a sixth arrangement example. The pixel unit 41f is different from the pixel unit 41d illustrated in FIGS. 17 and 19 in that the pixels 42f-8 receives green light. Accordingly, resolution of the green light is improved.

Furthermore, the pixel unit 41 may employ an arrangement in which the pixel 42d-7 which receives white light in the pixel unit 41d illustrated in FIGS. 17 and 19 receive green light.

Figure 23:
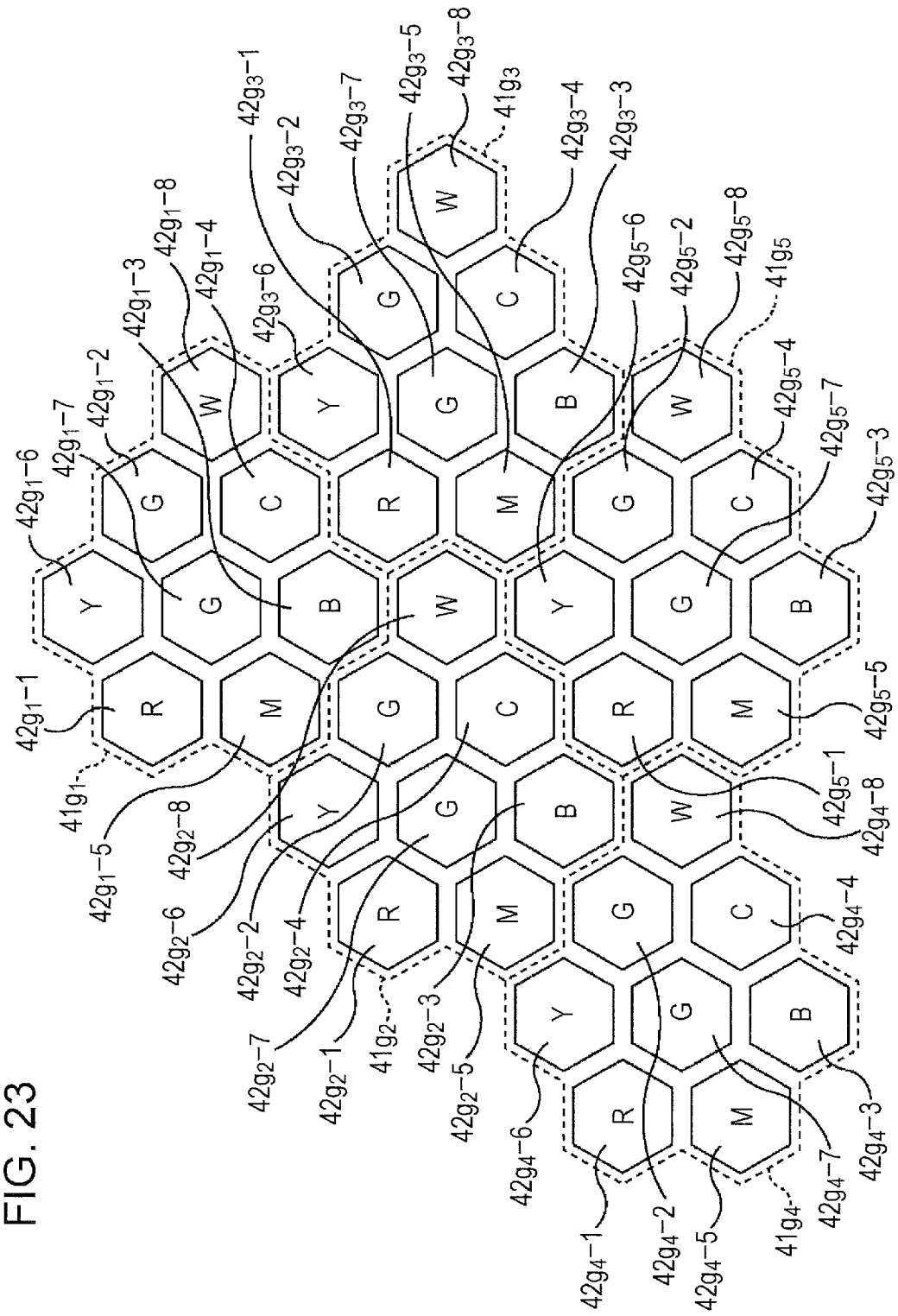
FIG. 23 is a diagram illustrating a configuration of a seventh arrangement example of a pixel unit including pixels arranged therein.

Specifically, FIG. 23 is a diagram illustrating a configuration of a pixel unit 41g including pixels 42g arranged as a seventh arrangement example. The pixel unit 41g is different from the pixel unit 41d illustrated in FIGS. 17 and 19 in that the pixels 42g-7 receives green light. Accordingly, resolution of the green light is improved.

Note that, as with the pixel unit 41d, each of the pixel units 41e to 41g covers an entire plane with the simple periodic structure in which the eight pixels 42 are periodically arranged. Furthermore, when a defect occurs in one of the pixels 42 and correction is performed on the defect pixel 42, false color is prevented from being generated, and the pixel sharing structure as illustrated with reference to FIG. 18 to FIGS. 20A and 20B may be employed.

Furthermore, the solid-state image sensor including the pixel units 21 and 41 which have the configurations described above and which are arranged on the light receiving plane may be employed in various electric apparatuses such as image pickup systems including digital still cameras and digital video cameras, cellular phones having an image pickup function, and other apparatuses having an image pickup function.

Figure 24:
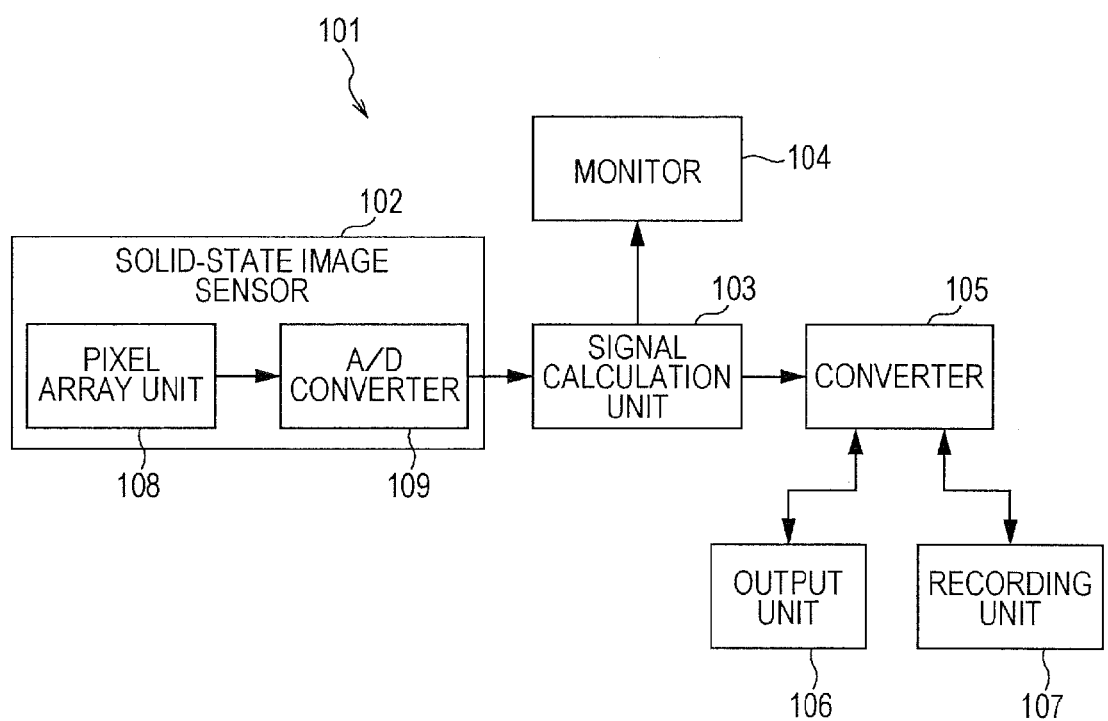
FIG. 24 is a block diagram illustrating a configuration of an image pickup device included in an electronic apparatus.

FIG. 24 is a block diagram illustrating a configuration of an image pickup device included in an electronic apparatus.

As illustrated in FIG. 24, an image pickup device 101 includes a solid-state image sensor 102, a signal calculation unit 103, a monitor 104, a converter 105, an output unit 106, and a recording unit 107 and is capable of capturing still images and moving images.

The solid-state image sensor 102 includes a pixel array unit 108 and an A/D converter 109. The pixel array unit 108 includes the pixel units 21 and 41 which have one of the configurations described above and which cover an entire light receiving plane. The pixel array unit 108 outputs pixel signals (color signals) corresponding to an image to be formed on a light receiving plane through an optical system, not shown, and the A/D converter 109 performs A/D conversion on the pixel signals and output the converted pixel signals.

The signal calculation unit 103 performs a signal synthesis process or a defect-pixel signal correction process on the pixel signals supplied from the A/D converter 109 where appropriate. For example, when it is set that signals of multiple colors are to be output, for example, the signal calculation unit 103 performs a process of correcting a defect of a pixel signal of a defect one of the pixels 42 in the pixel unit 41 by synthesizing another pixel signal selected from the pixels 42 in the same pixel unit 41. Furthermore, when it is set that signals of three primary colors are to be output, the signal calculation unit 103 performs the signal synthesis process and the defect-pixel signal correction process. In the signal synthesis process, the color signals of the three primary colors (RGB) are synthesized in accordance with Expression (1) to Expression (3) described above. Note that color signals output from the signal calculation unit 103 may be set in accordance with reaction of the monitor 104 and display environment of a user who uses the image pickup device 101.

The monitor 104 includes a liquid crystal panel or an organic EL (Electro Luminescence) panel and displays an image subjected to the signal processing performed by the signal calculation unit 103.

The converter 105 converts a data format of an image output from the image pickup device 101 in accordance with an apparatus which is a transmission destination of the image, and outputs the image to the output unit 106 and the recording unit 107.

To the output unit 106, an external monitor, for example, is connected, and the output unit 106 outputs the image supplied from the converter 105 to the external monitor which displays the image.

The recording unit 107 is a flush memory (such as an EEPROM (Electronically Erasable and Programmable Read Only Memory)), for example, and records the image supplied from the converter 105.

The image pickup device 101 configured as above may obtain high-quality images since the pixel units 21 or the pixel units 41 having one of the configurations described above are arranged so as to cover the entire light receiving plane in the solid-state image sensor 102.

Note that, in the image pickup device 101, when resolution of the monitor 104 is lower than that of the solid-state image sensor 102 and an image captured by the solid-state image sensor 102 is to be displayed in the monitor 104, the solid-state image sensor 102 operates the pixel units 41 in accordance with the resolution of the monitor 104. For example, the solid-state image sensor 102 alternately operates the pixel units 41 in a horizontal direction, alternately operates the pixel units 41 in a vertical direction, or alternately operates the pixel units 41 in horizontal and vertical directions so that a signal extraction operation is performed. By this, load and power consumption in the signal processing may be reduced and usability is improved.

Next, a process performed by the image pickup device 101 will be described with reference to FIG. 25.

When image capturing is started by the image pickup device 101, the pixel array unit 108 supplies pixel signals to the A/D converter 109 in the solid-state image sensor 102 in step S11.

In step S12, the A/D converter 109 performs A/D conversion on the pixel signals supplied from the pixel array unit 108 and supplies the converted pixel signals to the signal calculation unit 103.

In step S13, the signal calculation unit 103 determines whether color signals to be output are three-primary-color signals or multiple color signals in accordance with a setting.

When it is determined that the color signals to be output are three-primary-color signals in step S13, the process proceeds to step S14 where the signal calculation unit 103 performs the signal synthesis process and the defect-pixel signal correction process as described above.

In step S15, the signal calculation unit 103 outputs the pixel signals (color signals of RGB, for example) obtained as a result of the process in step S14, and the process is terminated.

On the other hand, in step S13, when it is determined that the color signals to be output are multiple color signals, the process proceeds to step S16 where the signal calculation unit 103 performs the defect pixel signal correction process as described above.

In step S17, the signal calculation unit 103 outputs pixel signals (RGB or CMY color signals) obtained as a result of the process in step S16, and the process is terminated.

As described above, in the image pickup device 101, it is determined whether the signal synthesis process is to be performed in accordance with a display environment of an image before three-primary-color pixel signals or multiple color pixel signals are output.

Note that, as the process of correcting a defect pixel signal, a general method, for example, a method for compensating for a target pixel signal using signals of pixels which have the same color and which are adjacent to the target pixel may be employed.

Note that, when a lens and an operation controller are attached to the image pickup device 101, a digital camera is obtained.

Note that it is not necessarily the case that the processes described with reference to the flowchart described above are performed in a time series manner in an order described in the flowchart, and the processes may be performed in parallel or the processes may be individually performed (for example, parallel processing or object processing).

Note that the present technique may be configured as below.

A solid-state image sensor includes pixel units and each of the pixel units has a group of pixels forming a polygonal outer shape to cover an entire light receiving plane. The polygonal outer shape has at least six equilateral sides and the group of pixels includes pixels receiving light of at least four different colors. Furthermore, each pixel in the group of pixels has a triangular shape. For example, the group of pixels may have six different colors, such as red, green, blue, cyan, magenta, and yellow. For example, red is located diagonally to cyan, green is located diagonally to magenta, and yellow is located diagonally to blue.

In one embodiment, at least two of six pixels in the group of pixels share a floating diffusion region, an amplification transistor, a selection transistor, and a reset transistor.

In another embodiment, three of the six pixels in the group of pixels share a floating diffusion region, an amplification transistor, a selection transistor, and a reset transistor.

In yet another embodiment, all the six pixels in the group of pixels share a floating diffusion region, an amplification transistor, a selection transistor, and a reset transistor.

A solid-state image sensor includes pixel units and each of the pixel units has a group of pixels forming an outer shape that defines an outer boundary of eight hexagonal areas. The pixel units are configured to cover an entire light receiving plane. The group of pixels includes six pixels respectively resident within six of the eight hexagonal areas, and the six pixels forming a ring have the same hexagonal shape. The ring surrounds either a white pixel or a green pixel. Another white pixel or another green pixel may be located outside of the ring. Also, the group of pixels includes pixels receiving light of at least four different colors. For example, the group of pixels may have six different colors, such as red, green, blue, cyan, magenta, and yellow. For example, red is located diagonally to cyan, green is located diagonally to magenta, and yellow is located diagonally to blue.

In one embodiment, at least two of six pixels in the group of pixels share a floating diffusion region, an amplification transistor, a selection transistor, and a reset transistor.

In another embodiment, three of the six pixels in the group of pixels share a floating diffusion region, an amplification transistor, a selection transistor, and a reset transistor.

In yet another embodiment, all the six pixels in the group of pixels share a floating diffusion region, an amplification transistor, a selection transistor, and a reset transistor.

(1) A solid-state image sensor including:
pixel units each of which includes a group of a plurality of pixels which have the same polygonal shape in plan view, which are regularly arranged so as to cover an entire plane, and which receive light beams of at least four or more colors.

(2) The solid-state image sensor according to (1)
wherein each of the pixel unit includes a group of at least six pixels and pairs of the pixels which receive light beams of complementary colors relative to each other are diagonally arranged.

(3) The solid-state image sensor according to (1) or (2),
wherein at least one of the plurality of pixels receives light which is not transmitted through a color filter.

(4) The solid-state image sensor according to any one of (1) to (3),
wherein each of the pixel units includes a group of eight pixels having a hexagonal outer shape in plan view, and the pixels are arranged such that one of the pixels positioned at a center is surrounded by six of the pixels and the other one of the pixels is arranged out of a block of the seven pixels.

(5) The solid-state image sensor according to any one of (1) to (4), wherein the pixel units employ a sharing structure in which the plurality of pixels share certain transistors.

(6) The solid-state image sensor according to any one of (1) to (5), wherein a pixel signal corresponding to a certain color which is to be obtained from one of the pixels is obtained by synthesizing a pixel signal corresponding to another color and the obtained pixel signal is output.

Note that the present disclosure is not limited to the foregoing embodiments and various modifications may be made without departing from the scope of the present disclosure.

The present disclosure contains subject matter related to that disclosed in Japanese Priority Patent Application JP 2011-273817 filed in the Japan Patent Office on Dec. 14, 2011, the entire contents of which are hereby incorporated by reference.

What is claimed is:

1. A solid-state image sensor including pixel units, each of the pixel units comprising:
a group of pixels forming a polygonal outer shape configured to cover a light receiving plane, the polygonal outer shape having at least six equilateral sides, wherein the group of pixels includes pixels configured to respectively receive light of at least four different colors and generate pixel signals, and
wherein each pixel is positioned such that the pixel signals generated from adjacent pixels and a diagonally opposite pixel are used to synthesize a pixel signal for the respective pixel.

2. The solid-state image sensor according to claim 1, wherein the group of pixels comprises six pixels configured to respectively receive light of at least six different colors.

3. The solid-state image sensor according to claim 2, wherein the at least six different colors include red, green, blue, cyan, magenta, and yellow.

4. The solid-state image sensor according to claim 2, wherein a first pixel of the six pixels is disposed diagonally opposite a second pixel of the six pixels that receives light of a color complementary to a color of light received by the first pixel.

5. The solid-state image sensor according to claim 2, wherein the pixel receiving light of red color is disposed diagonally opposite to the pixel receiving light of cyan color, the pixel receiving light of green color is disposed diagonally opposite to the pixel receiving light of magenta color, and the pixel receiving light of yellow color is disposed diagonally opposite to the pixel receiving light of blue color.

6. The solid-state image sensor according to claim 2, wherein at least two of the six pixels share a floating diffusion region, an amplification transistor, a selection transistor and a reset transistor.

7. The solid-state image sensor according to claim 2, wherein three of the six pixels share a floating diffusion region, an amplification transistor, a selection transistor and a reset transistor.

8. The solid-state image sensor according to claim 2, wherein the six pixels share a floating diffusion region, an amplification transistor, a selection transistor and a reset transistor.

9. The solid-state image sensor according to claim 1, wherein the group of pixels is configured to form a hexagonal outer shape and each pixel in the group of pixels has a triangular shape.

10. A solid-state image sensor including pixel units, each of the pixel units comprising:
a group of pixels forming an outer shape that defines an outer boundary of eight hexagonal areas, wherein the group of pixels includes six pixels respectively resident within six of the eight hexagonal areas, the six pixels having a same hexagonal shape, wherein the pixel units are configured to cover a light receiving plane, and
wherein the group of pixels receives light of at least four different colors, and wherein each pixel of the group of pixels is positioned such that pixel signals generated from adjacent pixels and a diagonally opposite pixel are used to synthesize a pixel signal for the respective pixel.

11. The solid-state image sensor according to claim 10, wherein the six pixels form a ring.

12. The solid-state image sensor according to claim 10, wherein the at least four different colors comprise at least four of red, green, blue, cyan, magenta, and yellow.

13. The solid-state image sensor according to claim 10, wherein the six pixels include at least one pair of pixels disposed diagonally to each other and receiving light of complementary colors.

14. The solid-state image sensor according to claim 10, wherein the six pixels comprise a red pixel disposed diagonally opposite to a cyan pixel, a green pixel disposed diagonally opposite to a magenta pixel, and a yellow pixel disposed diagonally opposite to a blue pixel.

15. The solid-state image sensor according to claim 10, wherein at least two of the six pixels share a floating diffusion region, an amplification transistor, a selection transistor and a reset transistor.

16. The solid-state image sensor according to claim 10, wherein three of the six pixels share a floating diffusion region, an amplification transistor, a selection transistor and a reset transistor.

17. The solid-state image sensor according to claim 10, wherein the six pixels share a floating diffusion region, an amplification transistor, a selection transistor and a reset transistor.

18. The solid-state image sensor according to claim 10, wherein the group of pixels comprises a white pixel being surrounded by a ring of the six pixels.

19. The solid-state image sensor according to claim 18, wherein the white pixel shares the floating diffusion region with the six pixels, and the floating diffusion region is disposed outside of the white pixel and is disposed inside the ring.

20. The solid-state image sensor according to claim 19, wherein the group of pixels further comprises one of a white pixel and a green pixel being disposed outside the ring.

21. The solid-state image sensor according to claim 10, wherein the group of pixels comprises a green pixel being surrounded by a ring of the six pixels.

22. The solid-state image sensor according to claim 21, wherein the green pixel shares a floating diffusion region with the six pixels, and the floating diffusion region is disposed outside the green pixel and inside the ring.

* * * * *